(12) United States Patent
Sanuki et al.

(10) Patent No.: US 10,872,900 B2
(45) Date of Patent: Dec. 22, 2020

(54) SYSTEM AND METHOD FOR CONTROLLING SEMICONDUCTOR MEMORY DEVICE INCLUDING MULTIPLE CHARGE STORAGE REGIONS

(71) Applicant: Toshiba Memory Corporation, Tokyo (JP)

(72) Inventors: Tomoya Sanuki, Suzuka Mie (JP); Yusuke Higashi, Zushi Kanagawa (JP); Hideto Horii, Yokohama Kanagawa (JP); Masaki Kondo, Yokkaichi Mie (JP); Hiroki Tokuhira, Kawasaki Kanagawa (JP); Hideaki Aochi, Yokkaichi Mie (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 16/283,627

(22) Filed: Feb. 22, 2019

(65) Prior Publication Data
US 2020/0091174 A1 Mar. 19, 2020

(30) Foreign Application Priority Data
Sep. 14, 2018 (JP) .................................. 2018-173113

(51) Int. Cl.
*G11C 16/00* (2006.01)
*H01L 27/11582* (2017.01)
(Continued)

(52) U.S. Cl.
CPC .... *H01L 27/11582* (2013.01); *G11C 16/0483* (2013.01); *G11C 16/16* (2013.01); *G11C 16/26* (2013.01); *H01L 27/1157* (2013.01)

(58) Field of Classification Search
CPC ................ G11C 16/0483; G11C 16/16; H01L 27/11582; H01L 27/1157
(Continued)

(56) References Cited

U.S. PATENT DOCUMENTS 9,287,406 B2   3/2016 Lue et al.
9,312,021 B2   4/2016 Lee et al.
(Continued)

FOREIGN PATENT DOCUMENTS

JP   2018-045749 A   3/2018

OTHER PUBLICATIONS

Hang-Ting Lue et.al., "A Novel Dual-Channel 3D NAND Flash Featuring both N-Channel and P-Channel NAND Characteristics for Bit-alterable Flash Memory and a New Opportunity in Sensing the Stored Charge in the WL Space", IEEE, IEDM 13-80, 2013.

*Primary Examiner* — Alfredo Bermudez Lozada
(74) *Attorney, Agent, or Firm* — Foley & Lardner LLP

(57) ABSTRACT

An example semiconductor device includes: n conductive layers including first to $n^{th}$ conductive layers stacked in a first direction; a first semiconductor region of a first conductive type; a second semiconductor region of a second conductive type closer to the $n^{th}$ conductive layer than the first semiconductor region; a semiconductor layer provided between the first semiconductor region and the second semiconductor region, extending in the first direction, penetrating the n conductive layers, and having an impurity concentration lower than a first conductive impurity concentration of the first region and a second conductive impurity concentration of the second region; n charge storage regions including first to $n^{th}$ charge storage regions provided between the n conductive layers and the semiconductor layer, and a control circuit that controls a voltage applied to the n conductive layers to always prevent charges (Continued)

from being stored in at least one of the n charge storage regions.

21 Claims, 13 Drawing Sheets

(51) Int. Cl.
*H01L 27/1157* (2017.01)
*G11C 16/16* (2006.01)
*G11C 16/26* (2006.01)
*G11C 16/04* (2006.01)

(58) Field of Classification Search
USPC .................................................. 365/185.17
See application file for complete search history.

(56) References Cited

U.S. PATENT DOCUMENTS

| | | |
|---|---|---|
| 9,853,040 B2 | 10/2017 | Chaar et al. |
| 9,922,717 B1 | 3/2018 | Maejima |
| 2012/0327714 A1 | 12/2012 | Lue |
| 2014/0361369 A1* | 12/2014 | Lue ................. G11C 16/14 257/347 |
| 2015/0131381 A1* | 5/2015 | Rhie ................ G11C 16/0483 365/185.17 |
| 2016/0005479 A1 | 1/2016 | Lee et al. |
| 2016/0049201 A1 | 2/2016 | Lue et al. |
| 2017/0271021 A1 | 9/2017 | Futatsuyama et al. |

\* cited by examiner

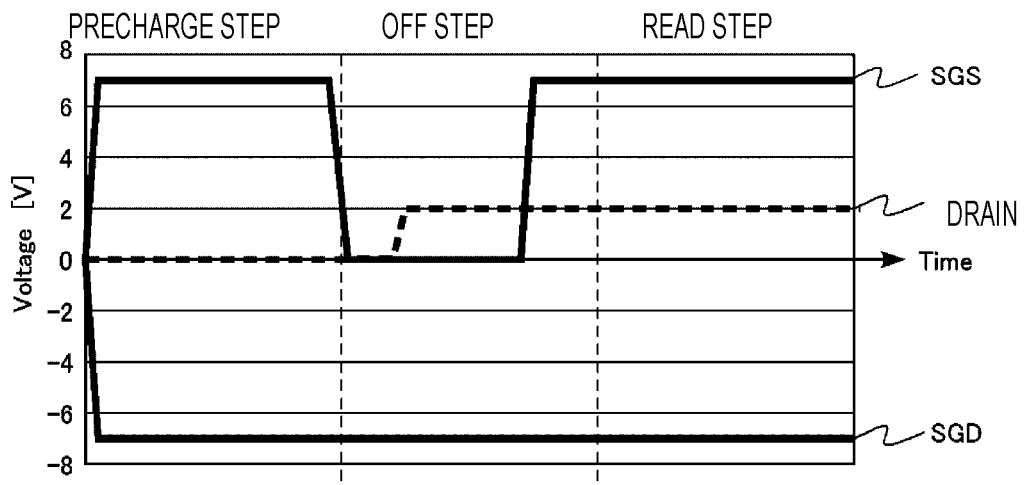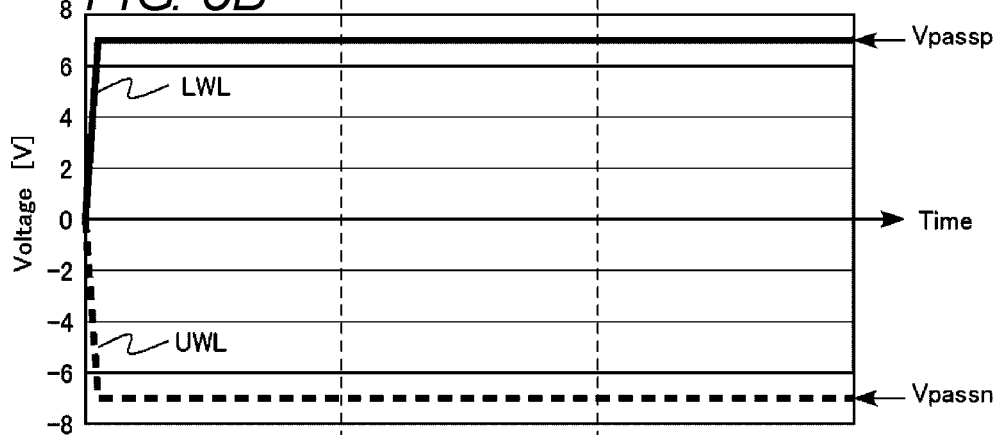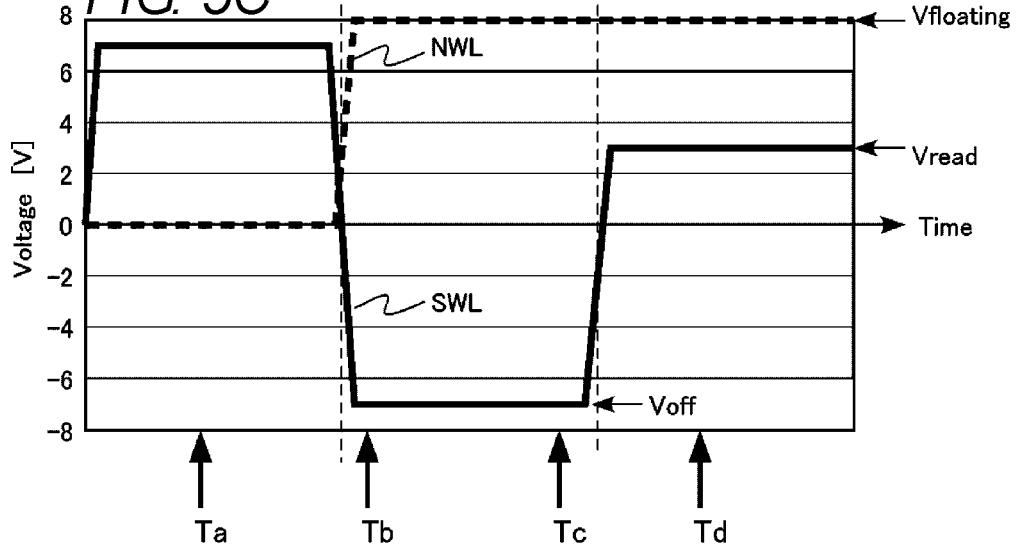

SYSTEM AND METHOD FOR CONTROLLING SEMICONDUCTOR MEMORY DEVICE INCLUDING MULTIPLE CHARGE STORAGE REGIONS

CROSS-REFERENCE TO RELATED APPLICATIONS

This application is based upon and claims the benefits and priority from Japanese Patent Application No. 2018-173113, filed on Sep. 14, 2018, the entire contents of which are incorporated herein by reference.

FIELD

Embodiments described herein relate generally to a semiconductor memory device and a method for controlling the semiconductor memory device.

BACKGROUND

A three-dimensional NAND flash memory in which memory cells are three-dimensionally arranged implements a high degree of integration and low cost. In order to improve the read characteristic of the three-dimensional NAND flash memory, a positive feedback type three-dimensional NAND flash memory has been proposed. In the proposed positive feedback type three-dimensional NAND flash memory, a p-type semiconductor region is provided at one end of a memory string. Since a transistor of the memory cell has a sharp subthreshold slope, the read characteristic is enhanced. In order to implement the high performance of the three-dimensional NAND flash memory, it is expected that the read characteristic of the positive feedback type three-dimensional NAND flash memory would be further enhanced.

Examples of related art include US-A-2016/0005479.

DESCRIPTION OF THE DRAWINGS

FIGS. 5A to 5C are timing charts of the data read sequence of the semiconductor memory device according to the first embodiment.

DETAILED DESCRIPTION

Figure 1:
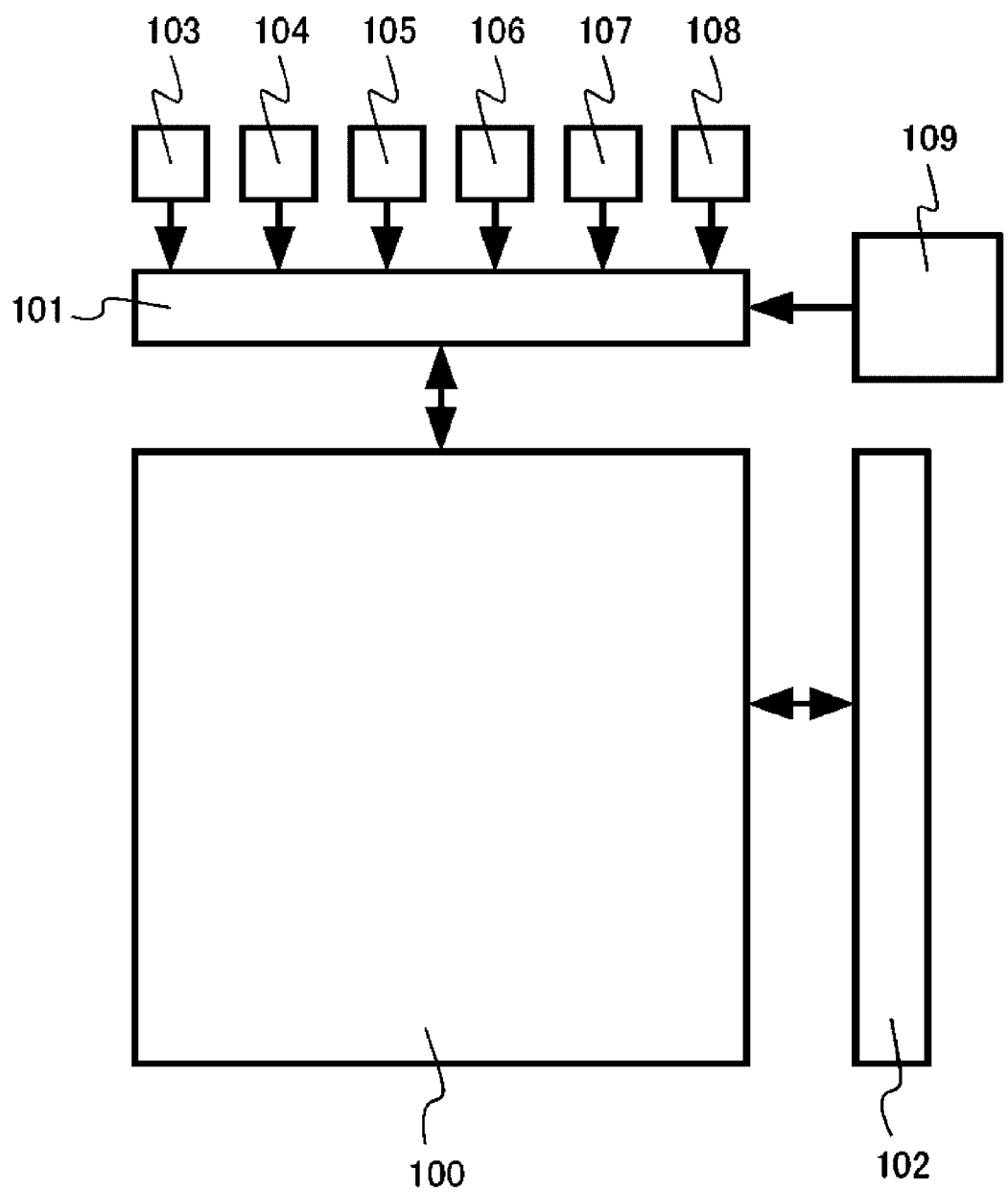
FIG. 1 is a block diagram of a semiconductor memory device according to a first embodiment.

Embodiments disclosed herein provide a semiconductor memory device and related control methods that enhance read characteristics of the semiconductor memory device.

In general, according to one embodiment, a semiconductor memory device includes the following: n conductive layers including first to $n^{th}$ conductive layers stacked in a first direction; a first semiconductor region of a first conductive type; a second semiconductor region of a second conductive type closer to the $n^{th}$ conductive layer than the first semiconductor region; a semiconductor layer provided between the first semiconductor region. The second semiconductor region, extends in the first direction, penetrates the n conductive layers, and has an impurity concentration lower than a first conductive impurity concentration of the first semiconductor region and lower than a second conductive impurity concentration of the second semiconductor region. The semiconductor memory device further includes: n charge storage regions including first to $n^{th}$ charge storage regions provided between the n conductive layers and the semiconductor layer; and a control circuit that controls a voltage applied to the n conductive layers so as to prevent charges from being stored in at least one of the n charge storage regions.

Hereinafter, embodiments of the present disclosure will be described with reference to the accompanying drawings. In the following description, for example, the same or similar members will be denoted by the same reference numerals, and explanations of members once described will be omitted as appropriate.

Further, in the present description, the term "above" or "below" may be used for the sake of convenience. The "above" or "below" is a term indicating a relative positional relationship within the drawing and is not a term that defines a positional relationship with respect to gravity.

In the present description, "voltage" refers to a potential difference from a ground potential unless otherwise defined.

First Embodiment

A semiconductor memory device according to a first embodiment includes n conductive layers including first to $n^{th}$ conductive layers stacked in a first direction, a first semiconductor region of a first conductive type, a second semiconductor region of a second conductive type closer to the $n^{th}$ conductive layer than the first semiconductor region, a semiconductor layer provided between the first semiconductor region and the second semiconductor region, extending in the first direction, penetrating the n conductive layers, and having an impurity concentration lower than a first conductive impurity concentration of the first semiconductor region and a second conductive impurity concentration of the second semiconductor region, n charge storage regions including first to $n^{th}$ charge storage regions provided between the n conductive layers and the semiconductor layer, and a control circuit that controls a voltage applied to the n conductive layers to always prevent charges from being stored in at least one of the n charge storage regions.

Further, the semiconductor memory device according to the first embodiment includes n conductive layers including first to $n^{th}$ conductive layers stacked in a first direction, a first semiconductor region of a first conductive type, a second semiconductor region of a second conductive type closer to the $n^{th}$ conductive layer than the first semiconductor region, a semiconductor layer provided between the first semiconductor region and the second semiconductor region, extending in the first direction, penetrating the n conductive layers, and having an impurity concentration lower than a first conductive impurity concentration of the first semiconductor region and a second conductive impurity concentration of the second semiconductor region, n charge storage regions including first to $n^{th}$ charge storage regions provided between the n conductive layers and the semiconductor layer, and a control circuit that reads data based on a charge amount in an $s^{th}$ charge storage region in a state where the semiconductor layer below an $s^{th}$ ($1 \leq s \leq n-1$) conductive layer is the second conductive type and the semiconductor layer below a $(s+1)^{th}$ conductive layer is the first conductive type, wherein at the time of reading the data based on the charge amount in the $s^{th}$ charge storage region, a $(s+1)^{th}$ charge storage region is always in a state where no charges is stored.

Hereinafter, a case where the first conductive type is an n type and the second conductive type is a p type will be described as an example.

Figure 2:
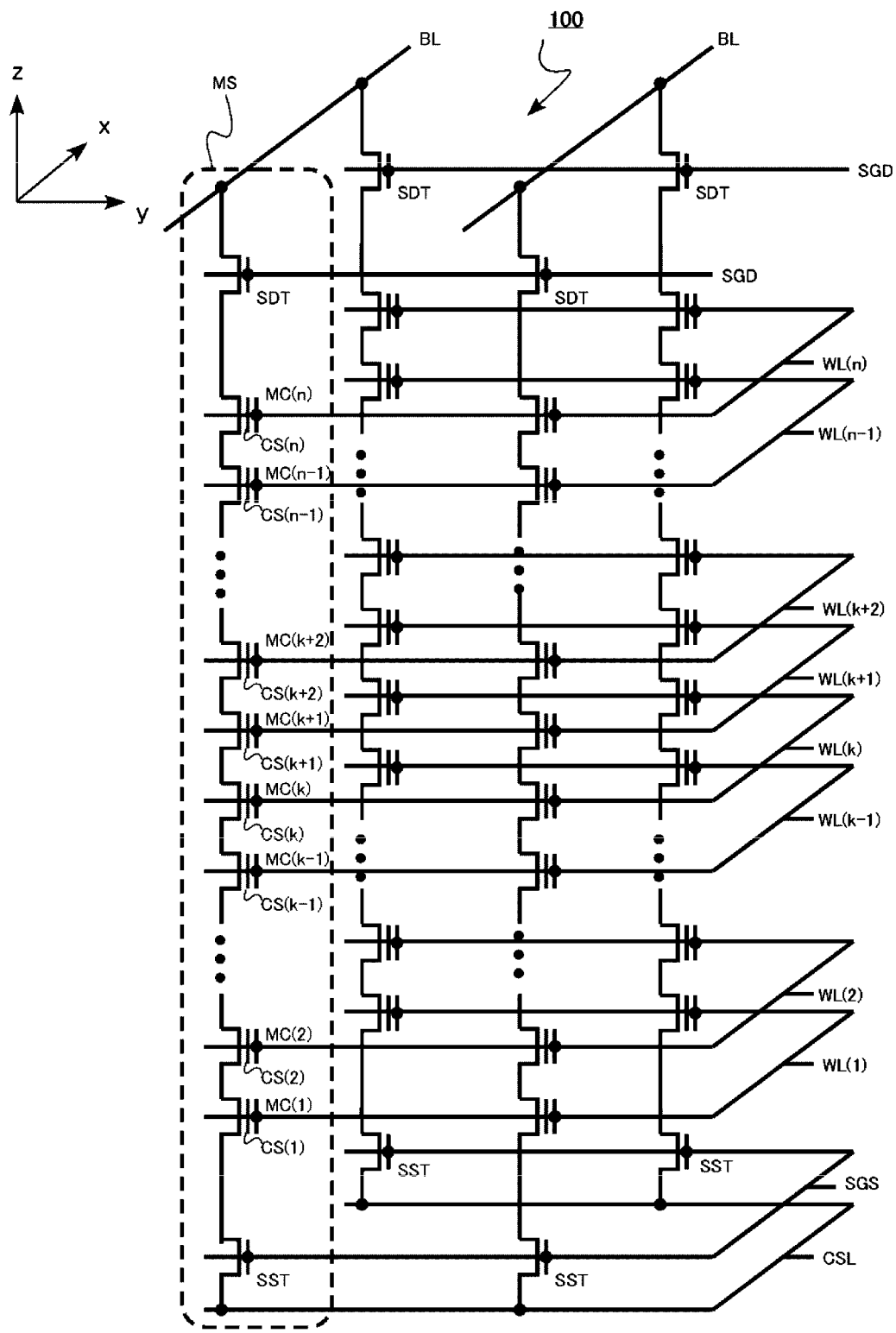
FIG. 2 is a circuit diagram of a memory cell array of the semiconductor memory device according to the first embodiment.
Figure 3:
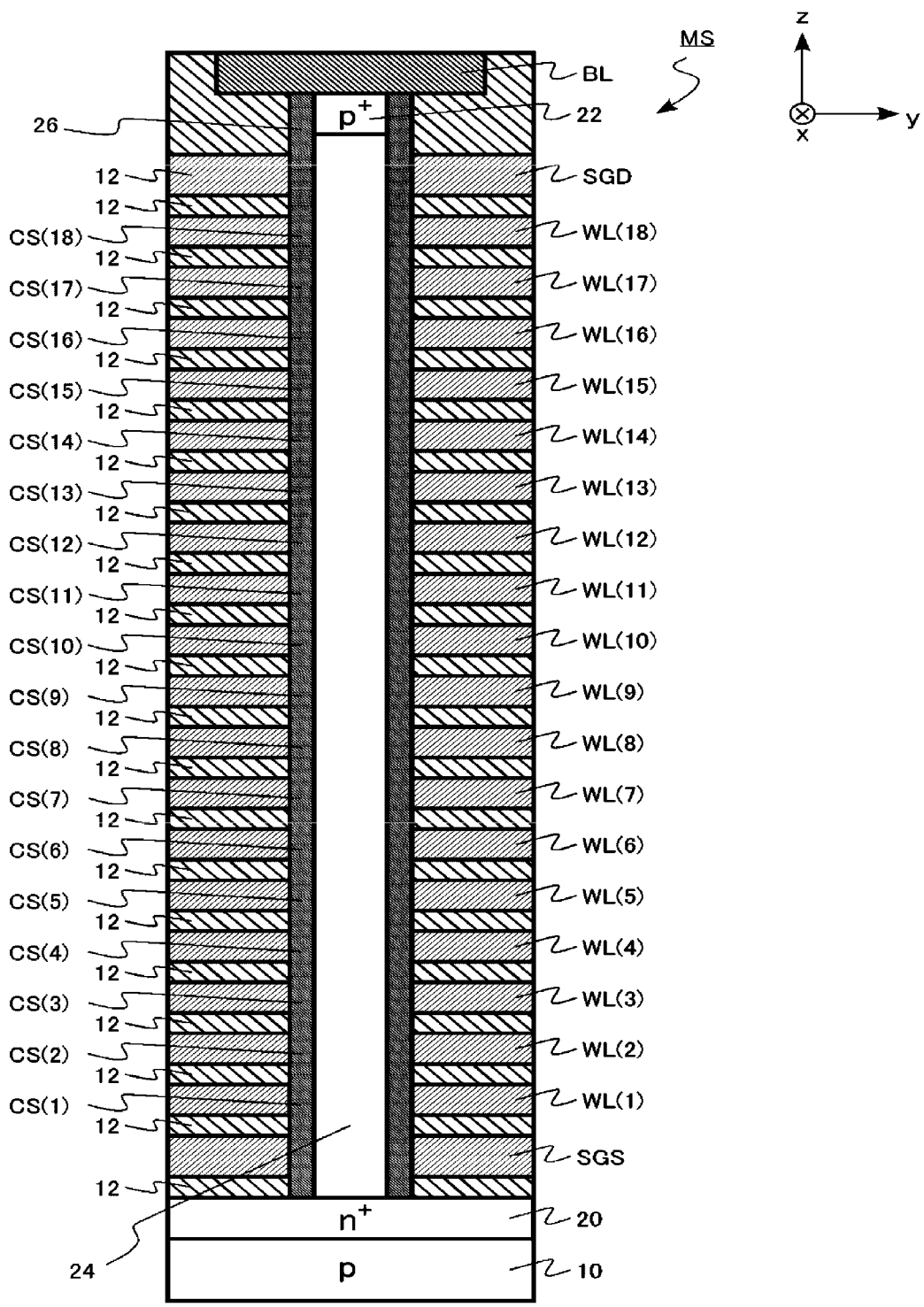
FIG. 3 is a schematic cross-sectional view of a memory string of the semiconductor memory device according to the first embodiment.

FIG. 1 is a block diagram of the semiconductor memory device according to the first embodiment. FIG. 2 is a circuit diagram of a memory cell array 100 of the semiconductor memory device according to the first embodiment. FIG. 3 is a schematic cross-sectional view of a memory string MS of the semiconductor memory device according to the first embodiment. FIG. 3 illustrates a cross section of one memory string MS surrounded by, for example, a dotted line in the memory cell array 100 of FIG. 2.

The semiconductor memory device according to the first embodiment is a three-dimensional NAND flash memory in which memory cells are arranged three-dimensionally. The semiconductor memory device according to the first embodiment is a positive feedback type three-dimensional NAND flash memory in which a p-type semiconductor region is provided at one end of the memory string.

The three-dimensional NAND flash memory according to the first embodiment includes a memory cell array 100, a first peripheral circuit 101, a second peripheral circuit 102, a write voltage (Vprogram) generation circuit 103, an off voltage (Voff) generation circuit 104, a read voltage (Vread) generation circuit 105, a pass voltage (Vpass) generation circuit 106, a floating voltage (Vfloating) generation circuit 107, an erase voltage (Verase) generation circuit 108, and a word line voltage control circuit 109. The word line voltage control circuit 109 is an example of the control circuit.

As illustrated in FIG. 2, the memory cell array 100 includes a plurality of word lines WL (conductive layers), a common source line CSL, a plurality of source select gate lines SGS, a plurality of drain select gate lines SGD, a plurality of bit lines BL, and a plurality of memory strings MS. In FIG. 2, an x direction (a second direction), a y direction (a third direction), and a z direction (a first direction) are orthogonal to each other.

The word lines WL are provided as many as "n" including first to $n^{th}$ word lines. The "n" is an integer of two (2) or more. The "n" word lines WL are stacked in the z direction. Each word line WL will be denoted as WL(k). The "k" is an integer of $1 \leq k \leq n$. WL(k) refers to a kth word line WL. WL(1), WL(2), WL(k−1), WL(k), WL(k+1), WL(k+2) . . . WL(n−1), and WL(n) are stacked in order toward the top from the bottom of the memory cell array 100.

As illustrated in FIG. 2, the memory string MS is constituted by a source select transistor SST, a plurality of memory cells MC, and a drain select transistor SDT, which are connected to each other in series between the common source line CSL and the bit line BL.

The memory cells MC are provided as many as "n" including first to $n^{th}$ memory cells. The "n" is an integer of two (2) or more. The "n" memory cells MC are connected to each other in series in the z direction. Each memory cell MC will be denoted as MC(k). The "k" is an integer of $1 \leq k \leq n$. MC(k) refers to a $k^{th}$ memory cell MC.

The memory cells MC have charge storage regions CS, respectively. The charge storage regions CS are provided as many as "n" including first to $n^{th}$ charge storage regions. Each charge storage region CS will be denoted as CS(k). The "k" is an integer of $1 \leq k \leq n$. CS(k) refers to a kth charge storage region CS.

FIG. 3 is a schematic cross-sectional view of one memory string MS. FIG. 3 illustrates a case where the number of word lines WL is 18, that is, n=18, as an example.

The memory string MS includes a semiconductor substrate 10, an interlayer insulating layer 12 (insulating layer), 18 word lines WL(1) to WL(18) including first to the $18^{th}$ word lines (hereinafter, also simply referred as the word line WL), an n-type semiconductor region 20 (a first semiconductor region), a p-type semiconductor region 22 (a second semiconductor region), a semiconductor layer 24, a charge storage film 26, a bit line BL, a source select gate line SGS, and a drain select gate line SGD. The charge storage film 26 includes first to 18th charge storage regions CS(1) to CS(18) (hereinafter, also simply referred to as the charge storage region CS).

The semiconductor substrate 10 is, for example, a single crystal p-type silicon substrate. The semiconductor substrate 10 contains, for example, boron (B) as a p-type impurity.

The word line WL is provided on the semiconductor substrate 10. The word line WL is, for example, a plate-like conductive layer. The interlayer insulating layer 12 is provided between the word lines WL. The word lines WL are stacked in the z direction. The word lines WL(1) to WL(18) serve as control electrodes of the memory cells MC(1) to MC(18) (hereinafter, also simply referred to as the memory cell MC), respectively.

The word line WL is, for example, a polycrystalline silicon containing a conductive impurity. Further, the word line WL is, for example, metal. The interlayer insulating layer 12 is, for example, silicon oxide.

The n-type semiconductor region 20 is provided in the semiconductor substrate 10. The n-type semiconductor region 20 contains an n-type impurity. The n-type impurity is, for example, phosphorus (P) or arsenic (As). An n-type impurity concentration of the n-type semiconductor region 20 is, for example, $1 \times 10^{19}$ cm$^{-3}$ or more. The n-type semiconductor region 20 functions as the common source line CSL. The n-type semiconductor region 20 may be provided as an independent region from the semiconductor substrate 10. For example, the n-type semiconductor region 20 may be provided on the semiconductor substrate 10 via an insulating layer.

The p-type semiconductor region 22 is closer to the word line WL(18) than the n-type semiconductor region 20. The p-type semiconductor region 22 is positioned on the bit line BL side of the semiconductor layer 24. The distance between the p-type semiconductor region 22 and the bit line BL is shorter than the distance between the n-type semiconductor region 20 and the bit line BL.

The p-type semiconductor region 22 contains a p-type impurity. The p-type semiconductor region 22 is, for example, polycrystalline silicon containing the p-type impurity. The p-type impurity is, for example, boron (B). The p-type impurity concentration of the p-type semiconductor region 22 is, for example, $1 \times 10^{19}$ cm$^{-3}$ or more.

The semiconductor layer 24 is provided between the n-type semiconductor region 20 and the p-type semiconductor region 22. The semiconductor layer 24 is in contact with the n-type semiconductor region 20 and the p-type semiconductor region 22. The semiconductor layer 24 penetrates the 18 word lines WL(1) to WL(18). The semiconductor layer 24 extends in the z direction. The semiconductor layer 24 is, for example, columnar or cylindrical. The semiconductor layer 24 is surrounded by the word lines WL(1) to WL(18).

The semiconductor layer 24 is, for example, polycrystalline silicon. The n-type impurity concentration of the semiconductor layer 24 is lower than the n-type impurity concentration of the n-type semiconductor region 20. Further, the p-type impurity concentration of the semiconductor layer 24 is lower than the p-type impurity concentration of the p-type semiconductor region 22. The n-type impurity concentration and the p-type impurity concentration of the semiconductor layer 24 are, for example, $1 \times 10^{17}$ cm$^{-3}$ or less. The semiconductor layer 24 is, for example, an intrinsic semiconductor.

The charge storage film 26 is provided between the word line WL and the semiconductor layer 24. The charge storage film 26 is provided, for example, around the semiconductor layer 24. The charge storage film 26 has a function to store charges in the charge storage film 26 by an electric field applied to the charge storage film 26. The charges stored in the charge storage film 26 may be erased by applying the electric field to the charge storage film 26.

The charge storage film 26 has, for example, a stacked structure of a silicon oxide film, a silicon nitride film, and a silicon oxide film. Further, the charge storage film 26 has, for example, a stacked structure of a silicon oxide film, a silicon film, and a silicon oxide film. The charge storage film 26 stores, for example, electrons in the silicon nitride film or the silicon film.

The first to 18th charge storage regions CS(1) to CS(18) are provided between the respective word lines WL(1) to WL(18) and the semiconductor layer 24. The charge storage regions CS(1) to CS(18) are a part of the charge storage film 26.

The memory cell MC is configured with the word line WL, the charge storage region CS, and the semiconductor layer 24. The memory cell MC has a function to hold data based on the charge amount in the charge storage region CS.

The data held in the memory cell MC is, for example, a threshold voltage of a memory cell transistor. The memory cell MC is able to store, for example, data of two values or more by using different threshold voltages.

The bit line BL is electrically connected to the p-type semiconductor region 22. The bit line BL is in contact with, for example, the p-type semiconductor region 22. The bit line BL has a function to transfer the data read from the memory cell MC. Further, the bit line BL has a function to transfer the data to be written to the memory cell MC. The bit line BL is, for example, metal.

The source select transistor SST has a function to select the memory string MS based on a signal applied to the source select gate line SGS. The drain select transistor SDT has a function to select the memory string MS based on a signal applied to the drain select gate line SGD.

For example, a ground potential is applied to the common source line CSL.

The first peripheral circuit 101 is connected to the plurality of word lines WL. The first peripheral circuit 101 has a function to select a desired word line WL. The first peripheral circuit 101 has a function to apply a commanded voltage to the selected word line.

The second peripheral circuit 102 is connected to the plurality of bit lines BL. The second peripheral circuit 102 has a function to select a desired bit line BL. Further, the second peripheral circuit 102 has a function to sense the data of the memory cell MC read from the selected bit line BL. In addition, the second peripheral circuit 102 has a function to transmit the data to be written to the memory cell MC, to the selected bit line BL. The second peripheral circuit 102 includes, for example, a sense amplifier circuit.

The write voltage (Vprogram) generation circuit 103 has a function to generate a write voltage Vprogram to be applied to the word line WL. The write voltage Vprogram is, for example, 20 V or more and 30 V or less.

The off voltage (Voff) generation circuit 104 has a function to generate an off voltage Voff to be applied to the word line WL. The off voltage Voff is, for example, a negative voltage. The off voltage is, for example, −9 V or more and −5 V or less.

The read voltage (Vread) generation circuit 105 has a function to generate a read voltage Vread to be applied to the word line WL. The read voltage Vread is, for example, 5 V or more and 9 V or less.

The pass voltage (Vpass) generation circuit 106 has a function to generate a positive pass voltage Vpassp and a negative pass voltage Vpassn to be applied to the word lines WL. The positive pass voltage Vpassp is, for example, 5 V or more and 9 V or less. The negative pass voltage Vpassn is, for example, −9 V or more and −5 V or less.

The floating voltage (Vfloating) generation circuit 107 has a function to generate a floating voltage Vfloating to be applied to the word line WL. The floating voltage Vfloating is, for example, 6 V or more and 10 V or less.

The erase voltage (Verase) generation circuit 108 has a function to generate an erase voltage Verase to be applied to the word line WL. The erase voltage Verase is, for example, −30 V or more and −20 V or less.

The word line voltage control circuit 109 has a function to control the voltage to be applied to the word line WL. The word line voltage control circuit 109 has a function to execute a write sequence, a read sequence, and an erase sequence for the memory cell MC. Based on a command from the word line voltage control circuit 109, a predetermined voltage is applied to the word line selected by the first peripheral circuit 101.

The first peripheral circuit 101, the second peripheral circuit 102, the write voltage (Vprogram) generation circuit 103, the off voltage (Voff) generation circuit 104, the read voltage (Vread) generation circuit 105, the pass voltage (Vpass) generation circuit 106, the floating voltage (Vfloating) generation circuit 107, the erase voltage (Verase) generation circuit 108, and the word line voltage control circuit 109 are implemented by, for example, electronic circuits using semiconductor devices formed on the semiconductor substrate 10.

The word line voltage control circuit 109 has a function to control the voltage to be applied to the n word lines WL so as to always prevent charges from being stored in at least one of the n charge storage regions CS. For example, the word line voltage control circuit 109 has a function to control the voltage to be applied to the word line WL(k) so as to always prevent charges from being stored in the kth charge storage region CS (k). In other words, at least one of the n memory cells MC does not have a function to hold data.

When n=18, the word line voltage control circuit 109 controls the voltage to be applied to the 18 word lines WL so as to always prevent charges from being stored in at least one of the 18 charge storage regions CS. In other words, the write voltage (Vprogram) is not always applied to at least one of the 18 word lines WL. At least one of the 18 memory cells MC does not have a function to hold data.

The memory cell MC that does not have the function to hold data as described above will be hereinafter referred to as a reference memory cell. Further, the word line WL to which the write voltage Vprogram is not always applied will be referred to as a reference word line RWL. Hereinafter, descriptions will be made on an example where charges are always prevented from being stored in the charge storage region 18 among the 18 charge storage regions CS, that is, an example where the word line WL 18 is the reference word line RWL.

In this case, the memory cell MC(18) becomes the reference memory cell that does not have the function to hold data. Accordingly, the 17 remaining memory cells including the memory cells MC(1) to MC(17) have the function to hold data.

The word line voltage control circuit 109 controls the write voltage Vprogram not to be always applied to the word line WL(18) with the charge storage region CS (18) interposed between the word line 18 and the semiconductor layer 24. Therefore, for example, the word line WL(18) may not be electrically connected to the write voltage generation circuit 103.

The word line voltage control circuit 109 has a function to control the voltage to be applied to the "n" word lines WL so as to, at the time of reading data based on a charge amount in, for example, an $s^{th}$ (0<s≤n) charge storage region CS(s) (hereinafter, also referred to as data of a memory cell MC(s)), preferentially perform reading of data in at least one charge storage region CS other than the $s^{th}$ charge storage region CS(s). The word line voltage control circuit 109 has a function to, at the time of reading data in, for example, a charge storage region CS(5), preferentially perform reading of data in at least one charge storage region CS other than the charge storage region CS(5). That is, the word line voltage control circuit 109 has a function to, at the time of reading data of a memory cell MC(5), preferentially perform reading of data of a memory cell MC other than the memory cell MC(5).

For example, the word line voltage control circuit 109 has a function to control the voltage to be applied to the "n" word lines WL so as to, at the time of reading data based on a charge amount in a $q^{th}$ (0≤q≤n) charge storage region CS (q) (hereinafter, also referred to as data of a memory cell MC (q)), preferentially perform reading and erasing of data of the charge storage regions CS between a charge storage region CS in which charges are prevented from being stored and the charge storage region CS (q), in order from the side of the charge storage region CS in which charges are prevented from being stored.

That is, for example, the word line voltage control circuit 109 has a function to control the voltage to be applied to the 18 word lines WL so as to, at the time of reading data of, for example, the memory cell MC(5), preferentially perform reading and erasing of data of the memory cells MC(6) to MC(17) which exist between the memory cells MC(5) to MC(18), in order from the side of the memory cell MC(18). The word line voltage control circuit 109 has a function to control the voltage to be applied to the 18 word lines WL so as to, prior to reading the data of the memory cell MC(5), perform reading and erasing of data of the memory cell MC(17), reading and erasing of data of the memory cell MC(16), reading and erasing of data of the memory cell MC(15), reading and erasing of data of the memory cell MC(14), reading and erasing of data of the memory cell MC(13), reading and erasing of data of the memory cell MC(12), reading and erasing of data of the memory cell MC(11), reading and erasing of data of the memory cell MC(10), reading and erasing of data of the memory cell MC(9), reading and erasing of data of the memory cell MC(8), reading and erasing of data of the memory cell MC(7), and reading and erasing of data of the memory cell MC(6) in this order.

Figure 4:
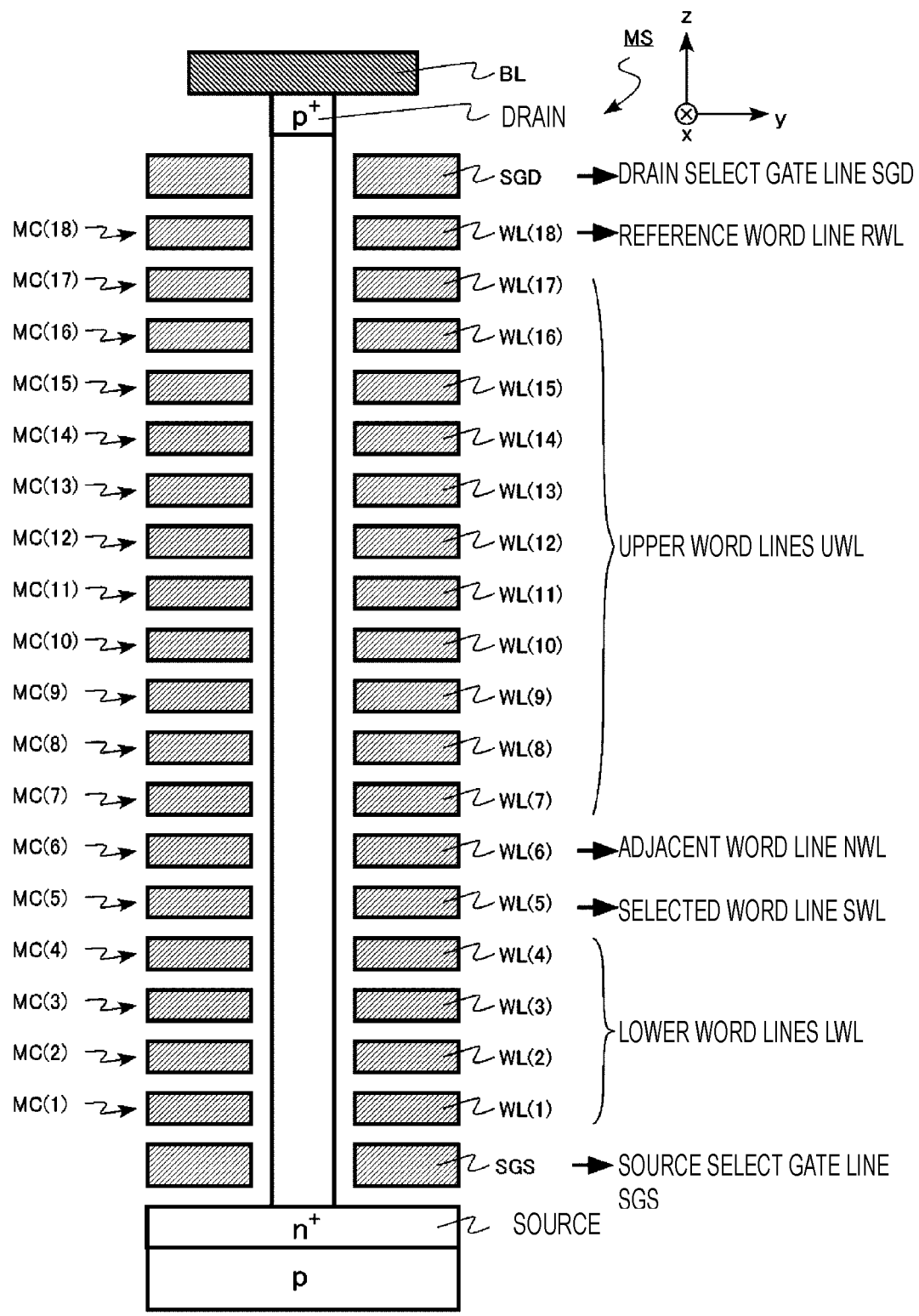
FIG. 4 is a schematic view illustrating a data read sequence of the semiconductor memory device according to the first embodiment.

Next, a basic operation of the 3D NAND flash memory according to the first embodiment will be described. FIG. 4 is a schematic view illustrating a data read sequence of the semiconductor memory device according to the first embodiment. FIGS. 5A to 5C are timing charts of the data read sequence of the semiconductor memory device according to the first embodiment.

At the time of reading data based on a charge amount in a pth (1<p<n) charge storage region, the word line voltage control circuit 109 applies a first positive voltage to at least one of first to (p−1)th conductive layers, applies a second negative voltage to at least one of (p+2)th to $n^{th}$ conductive layers, applies a third positive voltage to a (p+1)th conductive layer, and changes a fourth voltage applied to a pth conductive layer from a negative voltage to a positive voltage.

FIG. 4 illustrates designations of each layer and each region. Hereinafter, a case of reading the data of the memory cell MC controlled in the selected word line SWL will be described as an example. In particular, a case of reading the data of the memory cell MC(5), that is, a case of p=5 will be described as an example.

The selected word line SWL corresponds to the word line WL (5). An adjacent word line NWL which is adjacent to the selected word line SWL corresponds to the word line WL(6). Further, lower word lines LWL correspond to the word lines WL(1) to WL(4). In addition, upper word lines UWL correspond to the word lines WL(7) to WL(17). Further, the reference word line RWL corresponds to the word line WL(18). A source corresponds to the n-type semiconductor region 20, and a drain corresponds to the p-type semiconductor region 22.

As illustrated in FIGS. 5A to 5C, the read sequence for reading the data of the memory cell MC includes a precharge step, an off step, and a read step. A voltage value illustrated in FIGS. 5A to 5C is an example of a voltage value applied to each layer or each region.

FIG. 5A is a timing chart of the source select gate line SGS, the drain select gate line SGD, and the drain. FIG. 5B is a timing chart of the lower word lines LWL and the upper word lines UWL. FIG. 5C is a timing chart of the selected word line SWL and the adjacent word line NWL. Further, the source is always fixed to the ground potential, that is, 0 V.

The precharge step is a step for initializing a state of the memory cell MC before the read sequence. By the precharge step, for example, instability of the read operation is eliminated. Further, the precharge step may be omitted.

In the precharge step, the positive voltage (first voltage) is applied to the source select gate line SGS, the lower word lines LWL, and the selected word line SWL. The positive pass voltage Vpassp is applied to the lower word lines LWL.

The negative voltage (second voltage) is applied to the drain select gate line SGD, the upper word lines UWL, and the reference word line RWL. The negative pass voltage Vpassn is applied to the upper word lines UWL and the reference word line RWL. A voltage of 0 V is applied to the adjacent word line NWL. The drain voltage is 0 V (Ta in FIG. 5C).

In the precharge step, the electrons are stored and becomes n-type in the semiconductor layer 24 opposed to the source select gate line SGS, the lower word lines LWL, and the selected word line SWL. Further, holes are stored and become p-type in the semiconductor layer 24 opposed to the drain select gate line SGD, the upper word lines UWL, and the reference word line RWL.

The off step is a step for forming an energy barrier against the charges in the semiconductor layer 24. When the precharge step shifts to the off step, the voltage applied to the source select gate line SGS is lowered from the positive voltage to 0 V. The voltage applied to the selected word line SWL is changed from the positive voltage to the negative off voltage Voff. Further, the voltage applied to the adjacent word line NWL is changed from 0V to the positive floating voltage Vfloating (third voltage) (Tb in FIG. 5C).

By setting the voltage applied to the selected word line SWL to the negative voltage and the voltage applied to the adjacent word line NWL to the positive voltage, the energy barrier against the charge is formed in the semiconductor layer 24.

In the off step, after the energy barrier is formed in the semiconductor layer 24, the voltage applied to the drain is changed from 0 V to the positive voltage. Thereafter, the voltage applied to the source select gate line SGS is changed from 0 V to the positive voltage (Tc in FIG. 5C).

Figure 6:
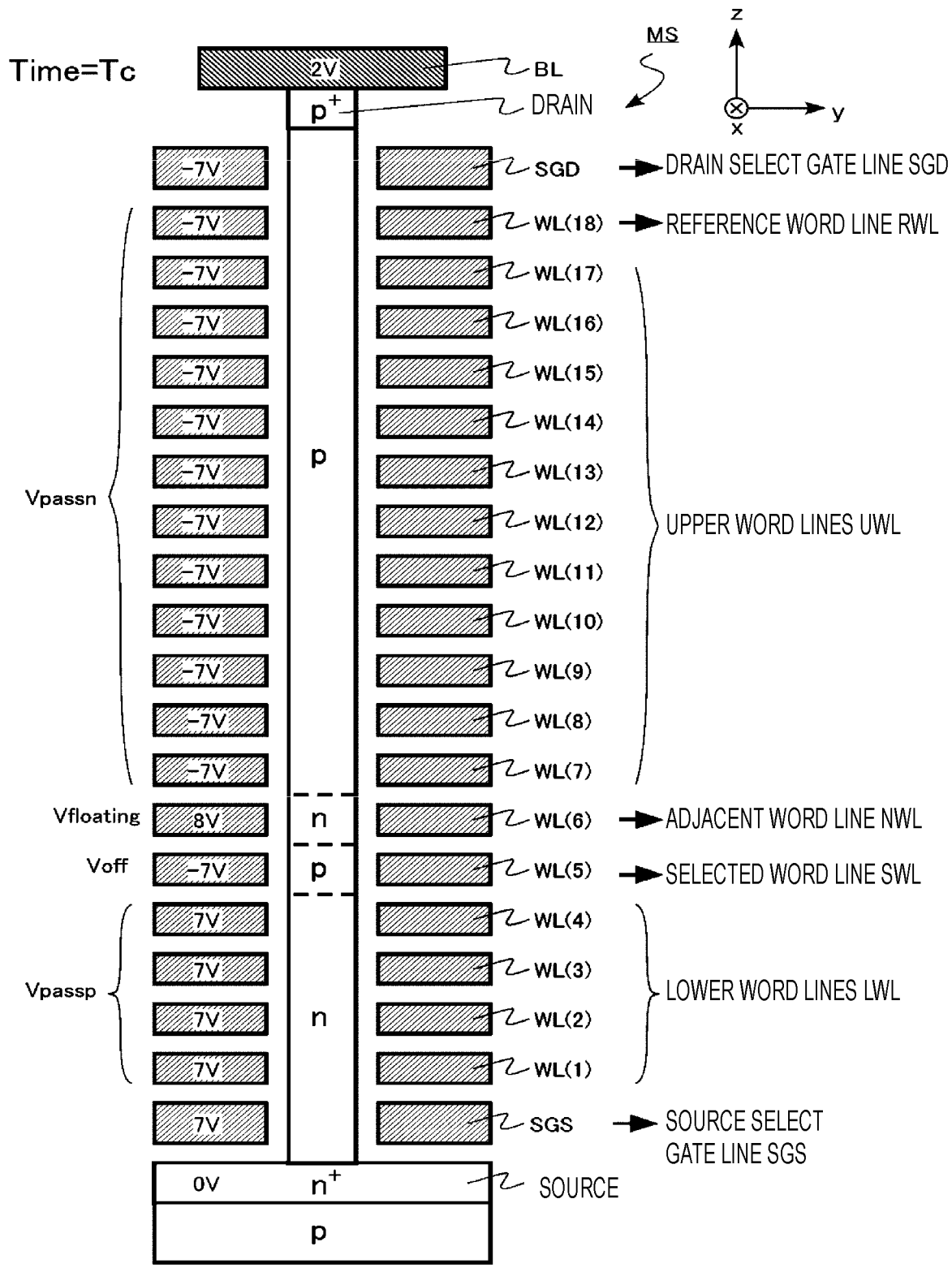
FIG. 6 is a schematic view illustrating the data read sequence of the semiconductor memory device according to the first embodiment.

FIG. 6 is a schematic view illustrating the data read sequence of the semiconductor memory device according to the first embodiment. FIG. 6 is a schematic cross-sectional view illustrating an applied voltage and a state of the semiconductor layer 24 at the time Tc of the read step. A voltage value illustrated in FIG. 6 is an example of a voltage value applied to each layer or each region.

As illustrated in FIG. 6, the voltage applied to the selected word line SWL is set to the negative voltage, and as a result, holes are stored and become the p type in the semiconductor layer 24 opposed to the selected word line SWL. Meanwhile, the voltage applied to the adjacent word line NWL is set to the positive voltage, and as a result, electrons are stored and become the n type in the semiconductor layer 24 opposed to the adjacent word line NWL. Therefore, a thyristor structure of npnp is formed in the semiconductor layer 24 from the source toward the drain.

Hereinafter, of the memory cells MC belonging to the selected memory string MS, the memory cell MC having the selected word line SWL will be referred to as a selected memory cell, and the memory cell having the adjacent word line NWL will be referred to as an adjacent memory cell.

The read step is a step of actually reading the data of the memory cell MC. The voltage (fourth voltage) applied to the selected word line SWL is changed from the negative off voltage Voff to the positive read voltage Vread (Td in FIG. 5C). As the energy barrier against the electrons below the selected word line SWL decreases, when the threshold voltage is low, a thyristor operation occurs and current flows between the source and the drain.

Figure 7:
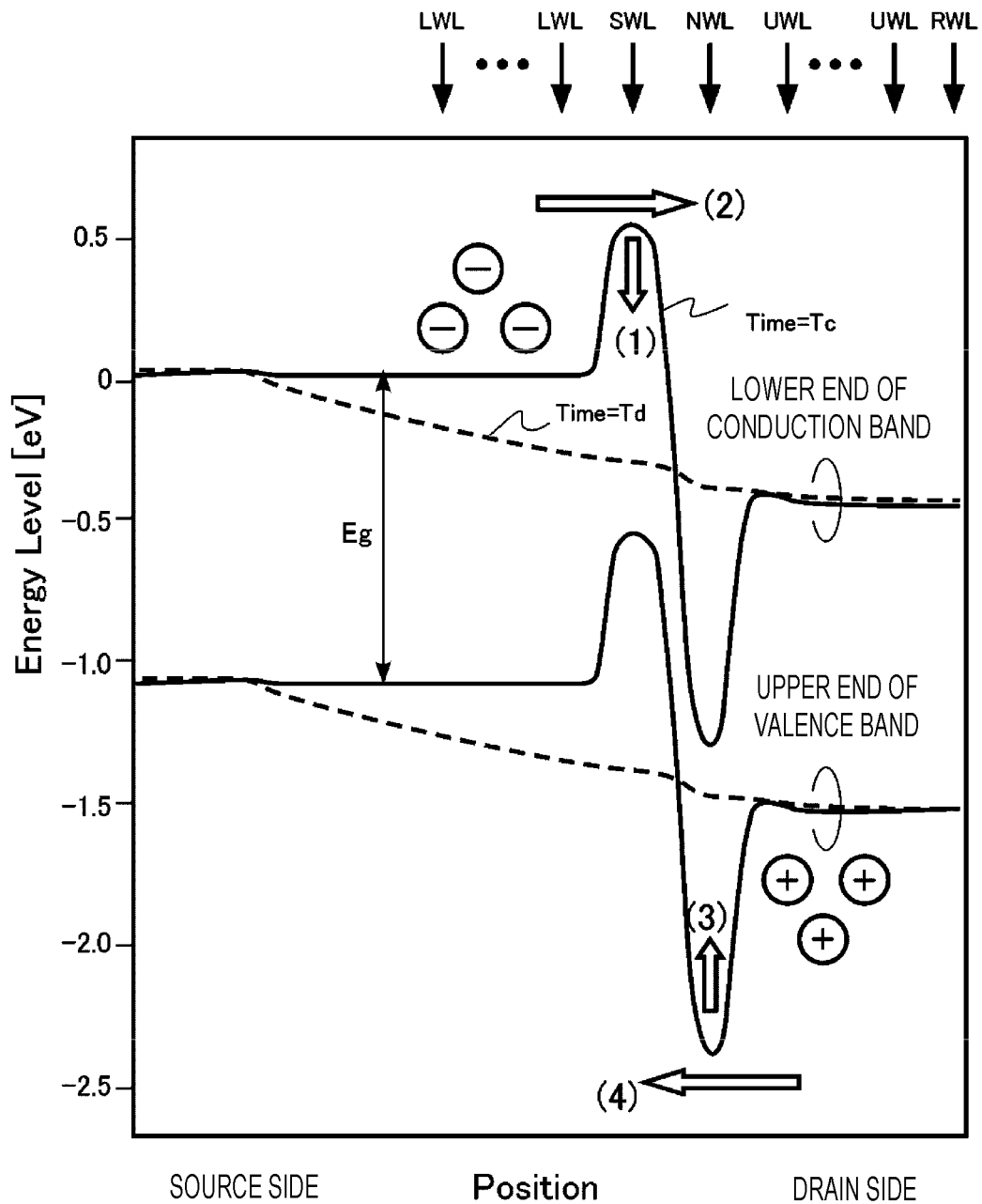
FIG. 7 is a band diagram illustrating the read sequence of the semiconductor memory device according to the first embodiment.

FIG. 7 is a band diagram illustrating the read sequence of the semiconductor memory device according to the first embodiment. FIG. 7 illustrates energy levels at a lower end of a conduction band and an upper end of a valence band in the time Tc of the off step and the time Td of the read step (see FIG. 5C). In FIG. 7, Eg represents band gap energy.

At the time Tc, since the negative off voltage Voff is applied to the selected word line SWL, the energy barrier against the electrons is formed below the selected word line SWL. In addition, since the positive voltage is applied to the adjacent word line NWL, the energy barrier against the hole is formed below the adjacent word line NWL. Since the energy barriers against the electron and the hole are formed, no current flows even when the positive voltage is applied to the drain.

At the time Td, the voltage applied to the selected word line SWL is raised from the negative off voltage Voff to the positive read voltage Vread. At this time, the energy barrier against the electrons below the selected word line SWL decreases (arrow (1) in FIG. 7). Since the energy barrier against the electrons decreases, when the threshold voltage is low, the electrons flow from the source toward the drain (arrow (2) in FIG. 7). As the electrons flow, the energy barrier against the holes below the adjacent word line NWL decreases (arrow (3) in FIG. 7). Since the energy barrier against the holes decreases, the holes flow from the drain toward the source (arrow (4) in FIG. 7).

As the holes flow, the energy barrier against the electrons below the selected word line SWL further decreases, so that a positive feedback is applied and the current flowing between the drain and the source rises steeply. In other words, the thyristor operation occurs. Finally, at the time Td, the energy barriers to the electrons and holes disappear and the current continues to flow.

Since the current flowing between the drain and the source rises sharply, an S factor of the memory cell MC decreases. Therefore, the data read characteristic of the memory cell MC is enhanced.

Further, a threshold voltage at which the thyristor operation occurs depends on the charge amount stored in the charge storage area CS of the memory cell MC. When the storage amount of the electrons is large, the energy barrier against the electrons below the selected word line SWL increases, and as a result, the threshold voltage increases. In this case, even though the positive read voltage Vread is applied to the selected word line SWL, the thyristor operation does not occur.

Meanwhile, when the storage amount of the electrons is small, the energy barrier against the electrons below the selected word line SWL decreases, and as a result, the threshold voltage decreases. In this case, when the positive read voltage Vread is applied to the selected word line SWL, the thyristor operation occurs.

By controlling the charge amount stored in the charge storage region CS, it is possible for the memory cell MC to hold data of two values or more.

Writing of data to the memory cell MC may be implemented by, for example, maintaining the voltage of the word line WL at the positive write voltage Vprogram with respect to the semiconductor layer 24 and injecting the electrons from the semiconductor layer 24 to the charge storage region CS.

Erasing of data of the memory cell MC may be implemented by, for example, maintaining the voltage of the word line WL at the negative erase voltage Verase with respect to the semiconductor layer 24 and extracting the electrons from the charge storage region CS to the semiconductor layer 24.

Next, a method for controlling the semiconductor memory device according to the first embodiment will be described.

The method for controlling the semiconductor memory device according to the first embodiment is a method for controlling the semiconductor memory device including n conductive layers including first to $n^{th}$ conductive layers stacked in a first direction, a first semiconductor region of a first conductive type, a second semiconductor region of a second conductive type closer to the $n^{th}$ conductive layer than the first semiconductor region, a semiconductor layer provided between the first semiconductor region and the second semiconductor region, extending in the first direction, penetrating the n conductive layers, and having an impurity concentration lower than a first conductive impurity concentration of the first semiconductor region and a second conductive impurity concentration of the second semiconductor region, and n charge storage regions including first to $n^{th}$ charge storage regions provided between then conductive layers and the semiconductor layer. In the method, charges are always prevented from being stored in at least one of the n charge storage regions.

The method for controlling the semiconductor memory device according to the first embodiment is the method for controlling the semiconductor memory device according to the first embodiment illustrated in FIG. 1. The method for controlling the semiconductor memory device according to the first embodiment relates to a method for reading the data stored in the memory cell MC.

The method for controlling the semiconductor memory device according to the first embodiment always prevents charges from being stored in at least one of the n charge storage regions. For example, when n=18, charges are always prevented from being stored in the charge storage region 18 of the 18 charge storage regions CS. That is, the memory cell MC(18) becomes the reference memory cell that does not have the function to hold data. By the word line voltage control circuit 109, the write voltage Vprogram is always prevented from being applied to the word line WL(18), and as a result, it is possible to make the memory cell MC(18) be the reference memory cell.

In the method for controlling the semiconductor memory device according to the first embodiment, at the time of reading data based on a charge amount in, for example, a $q^{th}$ (0≤q≤n) charge storage region CS(q), reading and erasing of data based on the charge amount of the charge storage regions CS between a charge storage region CS in which charges are always prevented from being stored and the charge storage region CS(q) are preferentially performed in order from the side of the charge storage region CS in which charges are always prevented from being stored. Hereinafter, it is assumed that in n=18 and q=5, charges are always prevented from being stored in the charge storage region 18.

In this case, at the time of reading the data of the memory cell MC(5), reading and erasing of data of the memory cells MC(6) to MC(17) which exist between the memory cells MC(5) and MC(18) are preferentially performed in order from the side of the memory cell MC(18).

First, reading and erasing of the data of the memory cell MC(17) are performed. The read sequence is executed on the memory cell MC(17). In this case, the word line WL(17) becomes the selected word line SWL, and the word line WL(18) of the memory cell MC(18) becomes the adjacent word line NWL. That is, the positive floating voltage Vfloating is applied to the word line WL(18). Thereafter, the erase voltage Verase is applied to the word line WL(17) to erase the data.

Next, similarly, reading and erasing of data of the memory cell MC(16), reading and erasing of data of the memory cell MC(15), reading and erasing of data of the memory cell MC(14), reading and erasing of data of the memory cell MC(13), reading and erasing of data of the memory cell MC(12), reading and erasing of data of the memory cell MC(11), reading and erasing of data of the memory cell MC(10), reading and erasing of data of the memory cell MC(9), reading and erasing of data of the memory cell MC(8), reading and erasing of data of the memory cell MC(7), reading and erasing of data of the memory cell MC(6) are performed in this order. With this control method, at the time of reading the data of the memory cell MC(5), the data of the charge storage regions CS(17) to CS(6) other than the memory cell MC(5) is preferentially performed.

After the data of the memory cell MC(6) is erased, the data of the memory cell MC(5) is read. That is, the read sequence is executed on the memory cell MC(5).

Next, an operation and an effect of the semiconductor memory device according to the first embodiment will be described.

Figure 8:
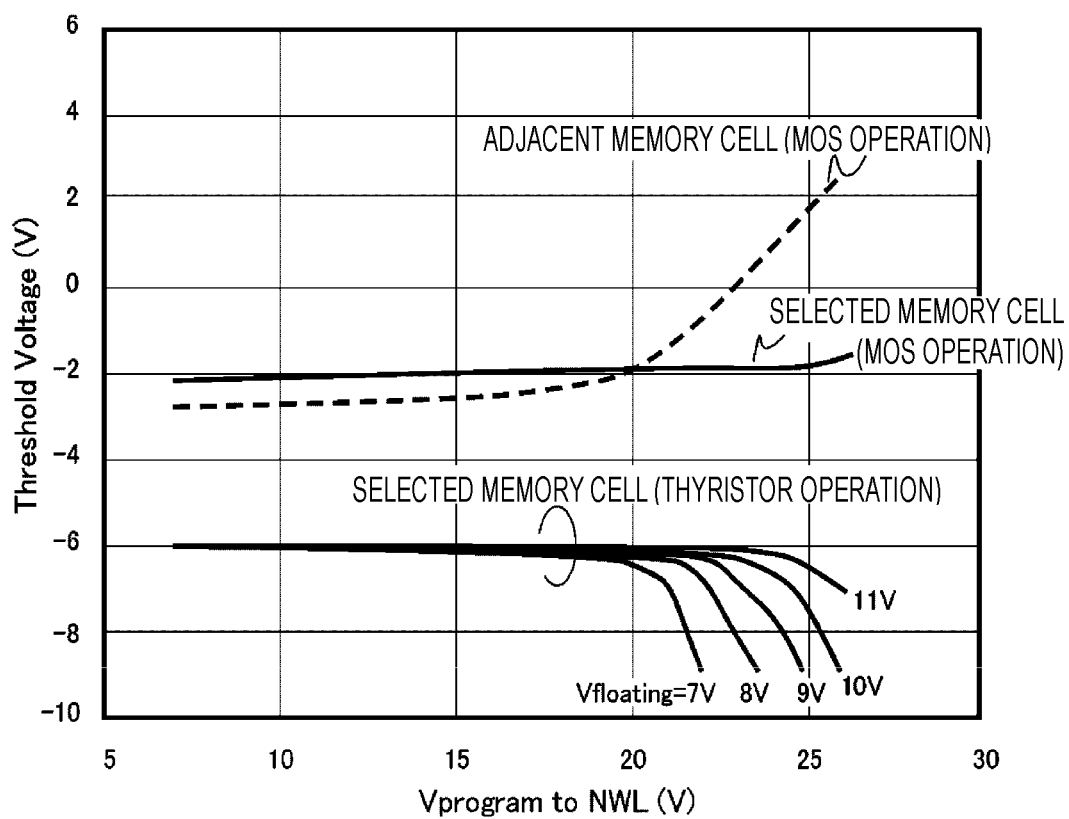
FIG. 8 is an explanatory diagram of an operation and an effect of the semiconductor memory device according to the first embodiment.

FIG. 8 is an explanatory diagram of an operation and an effect of the semiconductor memory device according to the first embodiment. FIG. 8 is a graph showing a relationship between a threshold voltage of the selected memory cell having the selected word line SWL and a threshold voltage of the adjacent memory cell having the adjacent word line NWL.

FIG. 8 illustrates the threshold voltage of the selected memory cell and the threshold voltage of the adjacent memory cell when the write voltage Vprogram is changed at the time of writing charges in the adjacent word line NWL. The threshold voltage of the selected memory cell represents a case of a metal oxide semiconductor (MOS) operation and a case of the thyristor operation. The threshold voltage of the adjacent memory cell represents the case of the MOS operation. The threshold voltage of the thyristor operation of the selected memory cell is measured by changing the floating voltage Vfloating applied to the adjacent word line NWL.

The threshold voltage of the adjacent memory cell rises as the write voltage Vprogram applied to the adjacent word line NWL increases. This is because the storage amount of the electrons in the charge storage region CS of the adjacent memory cell increases. There is almost no change in the threshold voltage of the MOS operation of the selected memory cell.

Meanwhile, the threshold voltage of the thyristor operation of the selected memory cell decreases as the write voltage Vprogram increases. This is considered to be due to the fact that as the threshold voltage of the MOS operation of the reference memory cell increases, the energy barrier against the holes of the semiconductor layer 24 opposed to the adjacent word line NWL decreases. The threshold voltage of the thyristor operation of the selected memory cell decreases due to the influence of the threshold voltage of the MOS operation of the reference memory cell. A decrease in the threshold voltage of the thyristor operation of the selected memory cell leads to erroneous reading of the data of the selected memory cell.

By increasing the floating voltage Vfloating applied to the adjacent word line NWL, it is possible to prevent the decrease in the threshold voltage of the thyristor operation of the selected memory cell. However, increasing the floating voltage Vfloating is undesirable because increasing the floating voltage Vfloating leads to the decrease of reliability of the three-dimensional NAND flash memory.

In the three-dimensional NAND flash memory according to the first embodiment, the reference memory cell having the charge storage region CS in which charges are always prevented from being stored is provided on the drain side of the memory string MS. The threshold voltage of the MOS operation of the reference memory cell is always kept at a low value because electrons are not written in the charge storage region CS. Therefore, when the reference memory cell is the adjacent memory cell, the decrease in the threshold voltage of the thyristor operation of the selected memory cell is prevented. Therefore, erroneous reading of the data of the selected memory cell is prevented.

In the three-dimensional NAND flash memory according to the first embodiment, when data of a desired memory cell MC is read, the data of the memory cells MC between the desired memory cell MC and the reference memory cell are sequentially read and erased, and as a result, the threshold voltage of the MOS operation of the adjacent memory cell is kept low. As a result, the erroneous reading of the data of the desired memory cell MC is suppressed.

Specifically, for example, at the time of reading the data of the memory cell MC (5), reading and erasing of the data of the memory cells MC(6) to MC(17) which exist between the memory cells MC(5) and MC(18) are preferentially performed in order from the side of the memory cell MC(18).

First, the reading of the data of the memory cell MC(17) is performed. Since the memory cell MC(18) is the reference memory cell, electrons are not stored in the charge storage region 18, and the threshold voltage of the MOS operation is low. Therefore, the erroneous reading of the data of the memory cell MC(17) does not occur.

Next, the erasing of the data of the memory cell MC(17) is performed. Since the charge storage region 17 becomes a state where no electrons are stored, the threshold voltage of the MOS operation of the memory cell MC(17) becomes low.

Next, the reading of the data of the memory cell MC(16) is performed. Since the threshold voltage of the MOS operation of the memory cell MC(17) is low, the erroneous reading of the data of the memory cell MC(16) does not occur.

Similarly, reading and erasing of data of the memory cell MC(16), reading and erasing of data of the memory cell MC(15), reading and erasing of data of the memory cell MC(14), reading and erasing of data of the memory cell MC(13), reading and erasing of data of the memory cell MC(12), reading and erasing of data of the memory cell MC(11), reading and erasing of data of the memory cell MC(10), reading and erasing of data of the memory cell MC(9), reading and erasing of data of the memory cell MC(8), reading and erasing of data of the memory cell MC(7), reading and erasing of data of the memory cell MC(6) are performed in this order. The threshold voltage of the MOS operation of the memory cell MC(6) becomes low.

At the time of reading the data of the memory cell MC (5), the threshold voltage of the MOS operation of the memory cell MC(6) which is the adjacent memory cell is low. Therefore, the erroneous reading of the data of the memory cell MC(5) does not occur.

As described above, in the three-dimensional NAND flash memory according to the first embodiment, erroneous reading of data of a desired memory cell MC is prevented. Therefore, a three-dimensional NAND flash memory may be implemented, which enables the enhancement of read characteristic.

A z-direction width of the reference word line RWL of the reference memory cell may be different from z-direction widths of the word lines WL of the other memory cells MC. With such a configuration, the optimization of the read characteristic is facilitated.

Further, a Z-direction width of the insulating layer 12 between the reference word line RWL and the word line WL may be different from the z-direction width of the insulating layer 12 between two word lines WL other than the reference word line RWL. With such a configuration, the optimization of the read characteristic is facilitated.

In addition, at the time of reading the data of the memory cell MC, an absolute value of the voltage (fifth voltage) applied to the reference word line RWL may be larger than an absolute value of the positive pass voltage Vpassp (first voltage) applied to the lower word lines LWL and an absolute value of the negative pass voltage Vpassn (second voltage) applied to the upper word lines UWL. With such a configuration, the resistance of the semiconductor layer 24 becomes low and the read characteristic is enhanced.

In addition, the floating voltage Vfloating (third voltage) applied to the adjacent word line NWL may be higher than the positive pass voltage Vpassp (first voltage) applied to the lower word lines LWL. With such a configuration, the data erroneous reading is prevented, and the read characteristic is enhanced.

At the time of reading data based on the charge amount in the pth (1<p<n) charge storage region, the word line voltage control circuit 109 may apply the floating voltage Vfloating (third voltage) to at least the (p+1)th word line WL(p+1) and the (p+2)th word line WL (p+2). That is, two or more adjacent word lines NWL may be provided. With such a configuration, the optimization of the read characteristic is facilitated.

In the first embodiment, in particular, a case where the selected word line SWL is the word line 5 is described as an example, but even when the selected word line SWL is a word line other than the word line 5, the read operation may be similarly performed. For example, when the selected word line SWL is the word line 1, at the time of reading the data of the memory cell MC (1), reading and erasing of data of the memory cells MC(2) to MC(17) which exist between the memory cells MC(1) and MC(18) are preferentially performed in order from the side of the memory cell MC(18).

In the first embodiment, a case where the number of memory cells MC of the memory string MS is 18 is described as an example, but the number of memory cells MC may be less than 18 or equal to or more than 19.

Further, for example, a dummy word line that does not function as the word line WL of the memory cell MC or the reference word line RWL of the reference memory cell may be provided between the word line WL(1) and the source select gate line SGS or between the word line WL(18) and the drain select gate line SGD. In this case, the reference word line RWL function as the adjacent word line NWL, whereas the dummy word line does not function as the adjacent word line NWL, so that the adjacent word line NWL and the dummy word line become different from each other.

As described above, according to the first embodiment, the reference memory cell that does not have the function to hold data is provided. Therefore, the threshold voltage of the thyristor operation of the selected memory cell is less affected by the threshold voltage of the adjacent memory cell. Therefore, a semiconductor memory device is implemented, in which the erroneous reading of the data of the selected memory cell is prevented and the enhancement of the read characteristic is enabled.

Second Embodiment

A semiconductor memory device of a second embodiment is different from the semiconductor memory device of the first embodiment in that at least one charge storage region includes an $m^{th}$ ($1<m<n$) charge storage region and at least one charge storage region includes an $x^{th}$ ($1 \leq x < n-9$) charge storage region and a $y^{th}$ ($y=x+9$) charge storage region. Hereinafter, a part of the description of contents duplicated with the semiconductor memory device of the first embodiment will be omitted.

Figure 9:
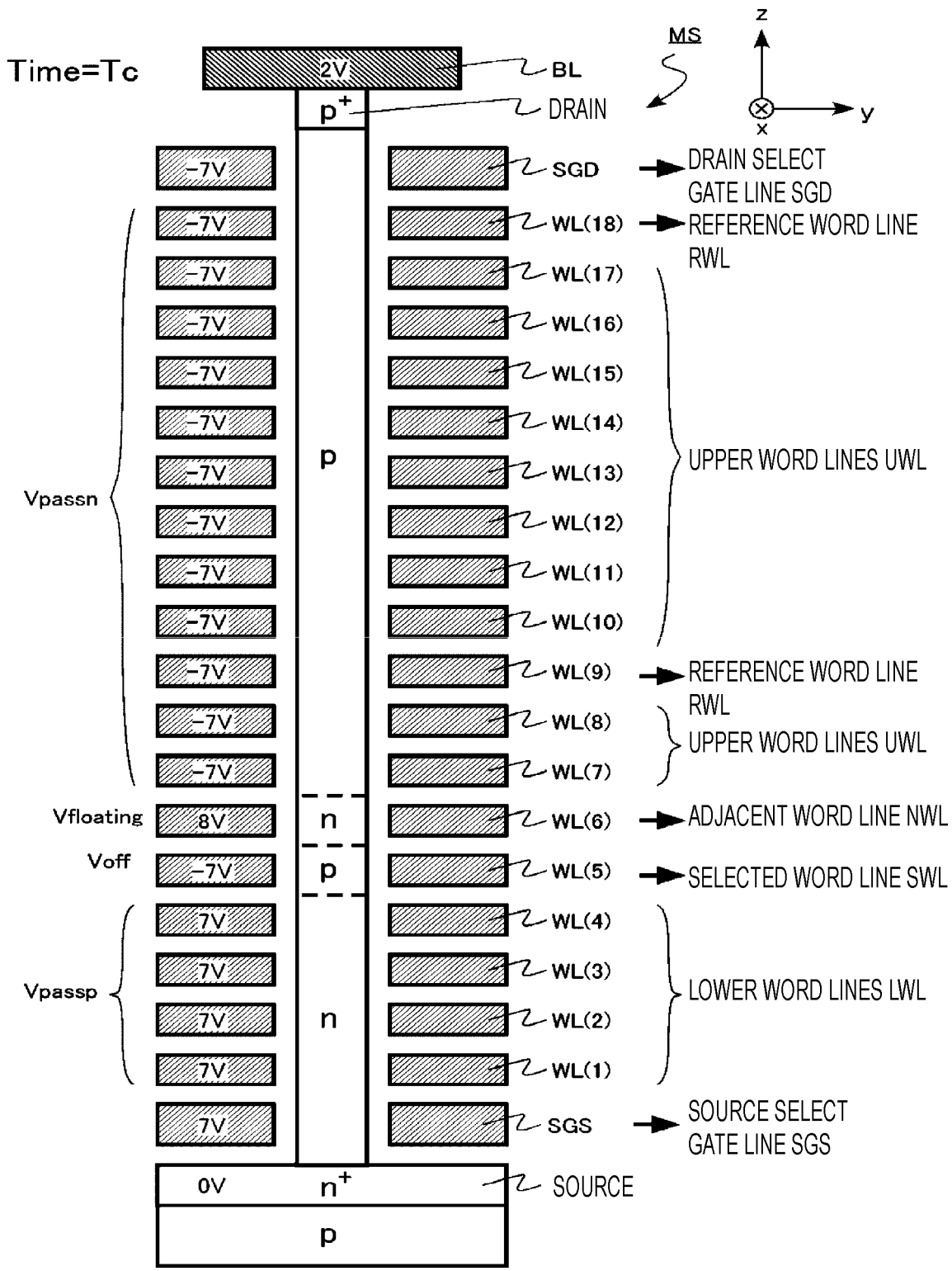
FIG. 9 is a schematic view illustrating a data read sequence of a semiconductor memory device according to a second embodiment.

FIG. 9 is a schematic view illustrating a data read sequence of the semiconductor memory device according to the second embodiment. FIG. 9 illustrates designations of each layer and each region. FIG. 9 is a diagram corresponding to FIG. 6 according to the first embodiment.

The semiconductor memory device according to the second embodiment is a three-dimensional NAND flash memory in which memory cells are arranged three-dimensionally. The semiconductor memory device according to the second embodiment is a positive feedback type three-dimensional NAND flash memory in which a p-type semiconductor region is provided at one end of the memory string.

In the three-dimensional NAND flash memory according to the second embodiment, the word line voltage control circuit 109 controls the voltage to be applied to the n word lines WL (conductive layers) so as to always prevent charges from being stored in an $m^{th}$ ($1<m<n$) charge storage region, an $x^{th}$ ($1 \leq x < n-9$) charge storage region, and a $y^{th}$ ($y=x+9$) charge storage region.

The three-dimensional NAND flash memory of the second embodiment includes two reference memory cells. At least one reference memory cell is provided between two memory cells MC other than the reference memory cell.

Hereinafter, a case in which the number of memory cells MC is 18 and the reference memory cells are the memory cell MC(9) including the 9th charge storage region CS(9) and the word line WL(9) and the memory cell MC(18) including the 18th storage charge region CS(18) and the word line WL(18), that is, a case of n=18 and m=x=9 will be described as an example. Of the 18 memory cells MC, the number of memory cells MC that have the function to hold data is 16, excluding the two reference memory cells.

Hereinafter, a method for controlling the three-dimensional NAND flash memory according to the second embodiment will be described with a case of reading data of the memory cell MC as an example. In particular, a case of reading the data of the memory cell MC(5) will be described as an example.

The selected word line SWL corresponds to the word line WL(5). An adjacent word line NWL adjacent to the selected word line SWL corresponds to the word line WL(6). Further, the lower word lines LWL correspond to the word lines WL(1) to WL(4). In addition, upper word lines UWL correspond to the word lines WL(7), WL(8), and WL(10) to WL(17). Further, reference word lines RWL correspond to the word lines WL(9) and WL(18).

By the word line voltage control circuit 109, the write voltage Vprogram is always prevented from being applied to the word lines WL(9) and WL(18), so that the memory cells MC(9) and (18) may serve the reference memory cells.

At the time of reading the data of the memory cell MC(5), reading and erasing of data of the memory cells MC(6) to MC(8) which exist between the memory cells MC(5) and MC(9) are preferentially performed in order from the side of the memory cell MC(9).

First, reading and erasing of the data of the memory cell MC(8) are performed. The read sequence is executed on the memory cell MC(8). In this case, the word line WL(8) becomes the selected word line SWL, and the word line WL(9) of the memory cell MC(9) becomes the adjacent word line NWL. That is, the positive floating voltage Vfloating is applied to the word line WL(9). Thereafter, the erase voltage Verase is applied to the word line WL(8) to erase the data.

Next, similarly, reading and erasing of data of the memory cell MC(7) and reading and erasing of data of the memory cell MC(6) are performed. After the data of the memory cell MC (6) is erased, the data of the memory cell MC (5) is read. The read sequence is executed on the memory cell MC (5).

In the three-dimensional NAND flash memory according to the second embodiment, erroneous reading of data of a desired memory cell MC is prevented as in the first embodiment. Therefore, a three-dimensional NAND flash memory may be implemented, which enables the enhancement of the read characteristic.

In addition, unlike the first embodiment, since two or more reference memory cells are provided, when reading data of the memory cell MC, it is possible to shorten the time required for reading and erasing data of the other memory cells MC which are preferentially performed. Therefore, a data reading speed of the three-dimensional NAND flash memory is enhanced.

In addition, each side of the eight memory cells including the first memory cell MC(1) to the 8th memory cell MC(8) and the 8th memory cells including the 10th memory cell MC(10) to the 17th memory cell MC(17) may be made as a single unit. In other words, one byte may be made as a single unit, and a three-dimensional NAND flash memory suitable for a system application may be implemented.

As described above, according to the second embodiment, similar to the first embodiment, a semiconductor memory device is implemented, in which the erroneous reading of data of the selected memory cell is prevented and the enhancement of the read characteristic is enabled. Further, a three-dimensional NAND flash memory may be implemented, which enhances the data reading speed and is suitable for the system application.

Third Embodiment

A semiconductor memory device of a third embodiment is different from the semiconductor memory devices of the first and second embodiments in that at least one charge storage region is one of two adjacent charge storage regions among n charge storage regions. Hereinafter, a part of description of contents duplicated with the semiconductor memory device of the first and second embodiments will be omitted.

Figure 10:
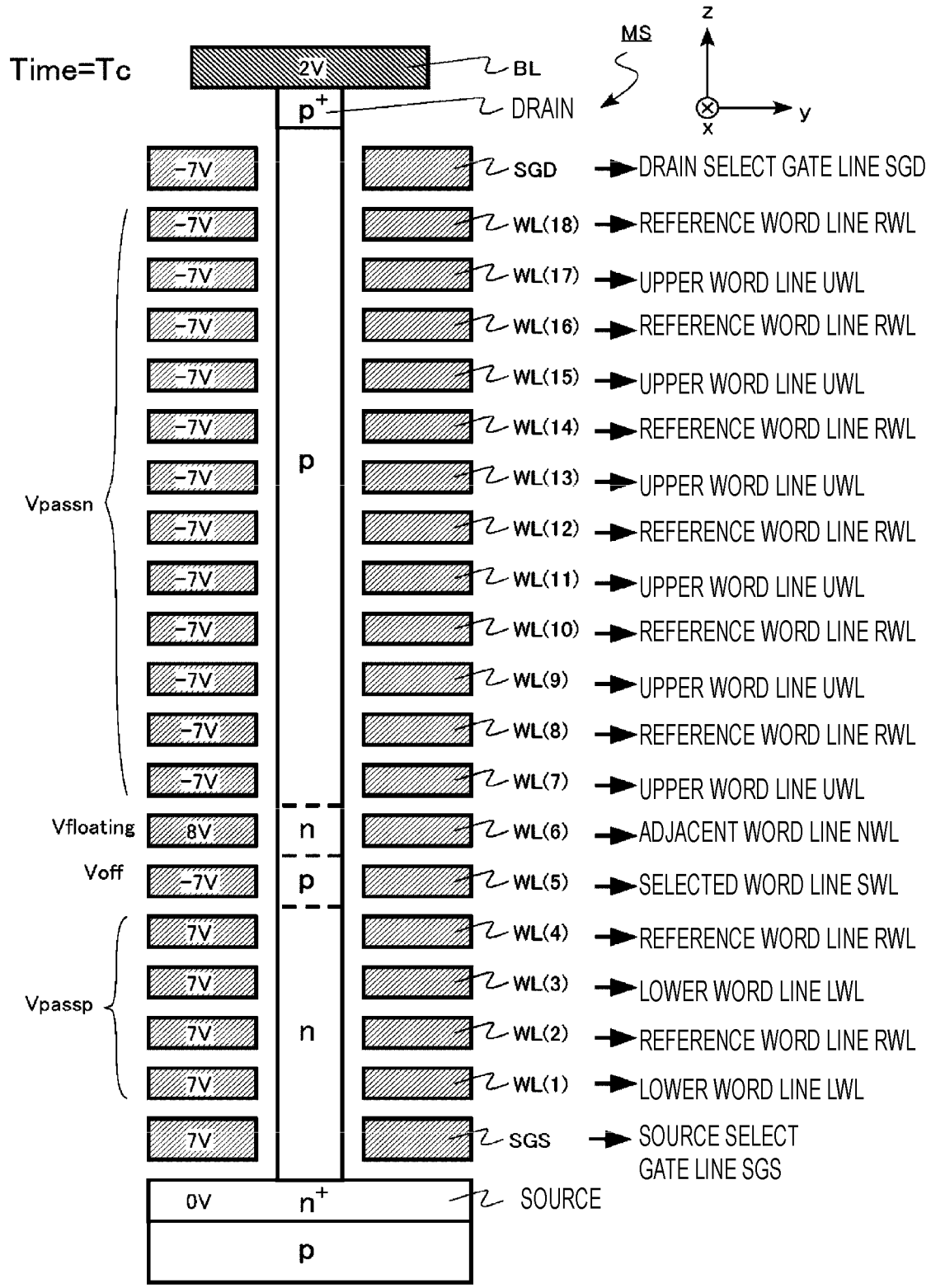
FIG. 10 is a schematic view illustrating a data read sequence of a semiconductor memory device according to a third embodiment.

FIG. 10 is a schematic view illustrating a data read sequence of the semiconductor memory device according to the third embodiment. FIG. 10 illustrates designations of each layer and each region. FIG. 10 is a diagram corresponding to FIG. 6 according to the first embodiment.

The semiconductor memory device according to the third embodiment is a three-dimensional NAND flash memory in which memory cells are arranged three-dimensionally. The semiconductor memory device according to the third embodiment is a positive feedback type three-dimensional NAND flash memory in which a p-type semiconductor region is provided at one end of the memory string.

In the three-dimensional NAND flash memory according to the third embodiment, the word line voltage control circuit 109 controls the n word lines WL (conductive layers) so as to always prevent charges from being stored in one of two adjacent charge storage regions among n charge storage regions.

In the three-dimensional NAND flash memory of the third embodiment, one of two adjacent memory cells MC is always a reference memory cell. The two adjacent memory cells MC are paired, and one is a reference memory cell which does not have the function to hold data, and the other is a memory cell MC which has the function to hold data.

Hereinafter, a case where the number of memory cells MC is 18, that is, n=18 will be described as an example. Of the 18 memory cells MC, the number of memory cells MC that have the function to hold data is 9.

Hereinafter, the method for controlling the three-dimensional NAND flash memory according to the third embodiment will be described with a case of reading data of the memory cell MC as an example. In particular, a case of reading the data of the memory cell MC(5) will be described as an example.

The selected word line SWL corresponds to the word line WL(5). An adjacent word line adjacent to the selected word line SWL corresponds to the word line WL(6). Further, lower word lines LWL correspond to the word lines WL(1) and WL(3). In addition, upper word lines UWL correspond to the word lines WL(7), WL(9), WL(11), WL(13), WL(15), and WL(17). Further, reference word lines RWL correspond to the word lines WL(2), WL(4), WL(6), WL(8), WL(10), (12), (14), WL(16), and WL(18).

By the word line voltage control circuit 109, the write voltage Vprogram is always prevented from being applied to the word lines WL(2), WL(4), WL(6), WL(8), WL(10), WL(12), WL(14), WL(16), and WL(18), so that the word lines WL(2), WL(4), WL(6), WL(8), WL(10), WL(12), WL(14), WL(16), and WL(18) may serve as the reference memory cells.

When reading data of the memory cell MC(5), since the memory cell MC (6) is the reference memory cell, electrons are not stored in the charge storage region 6 and the threshold voltage of the MOS operation is low. Therefore, the erroneous reading of the data of the memory cell MC(5) does not occur.

In the three-dimensional NAND flash memory according to the third embodiment, erroneous reading of data of a desired memory cell MC is prevented as in the first embodiment. Therefore, a three-dimensional NAND flash memory may be implemented, which enables the enhancement of the read characteristic.

Further, unlike the first embodiment, one reference memory cell is provided with respect to two adjacent memory cells MC. As a result, at the time of reading data of one memory cell MC, reading and erasing of data of the other memory cell MC need not be preferentially performed. Therefore, a time required for reading the data of the memory cell MC may be shortened. Therefore, the data reading speed of the three-dimensional NAND flash memory is enhanced.

As described above, according to the third embodiment, similar to the first embodiment, a semiconductor memory device is implemented, in which the data erroneous reading of the selected memory cell is prevented and the enhancement of the read characteristic is enabled. Further, a three-dimensional NAND flash memory may be implemented, which enhances the data reading speed.

Fourth Embodiment

The semiconductor memory device of the fourth embodiment is different from the semiconductor memory device of the first embodiment in that the arrangement of the first semiconductor region and the second semiconductor region and the arrangement of the conductive layers are vertically inverted. Hereinafter, a part of the description of contents duplicated with the semiconductor memory device of the first embodiment will be omitted.

The semiconductor memory device according to the fourth embodiment is a three-dimensional NAND flash memory in which memory cells are arranged three-dimensionally. The semiconductor memory device according to the fourth embodiment is a positive feedback type three-dimensional NAND flash memory in which a p-type semiconductor region is provided at one end of the memory string.

Figure 11:
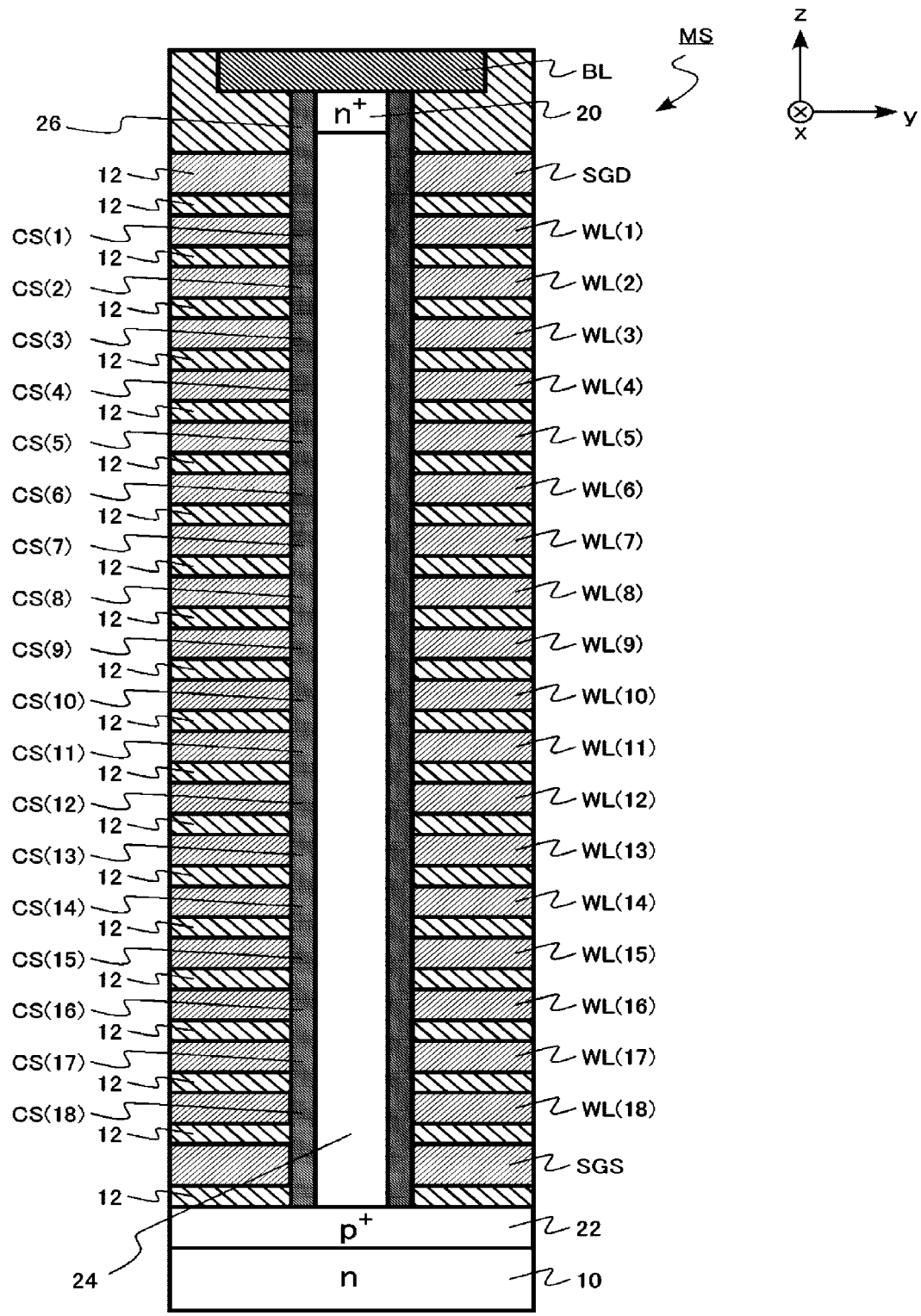
FIG. 11 is a schematic cross-sectional view of a memory string of a semiconductor memory device according to a fourth embodiment.

FIG. 11 is a schematic cross-sectional view of a memory string MS of the semiconductor memory device according to the fourth embodiment. FIG. 11 is a schematic cross-sectional view of one memory string MS. FIG. 11 illustrates a case where the number of word lines WL is 18, that is, n=18.

In a three-dimensional NAND flash memory of the fourth embodiment, n word lines WL including first to $n^{th}$ word lines are provided. The n word lines WL are stacked in the z direction. Each word line WL will be denoted as WL(k). The "k" is an integer of $1 \le k \le n$. WL(k) refers to as a kth word line WL. WL(1), WL(2), . . . WL(k−1), WL(k), WL(k+1), WL(k+2) . . . WL(n−1), and WL(n) are stacked in order toward the bottom from the top of the memory cell array 100.

The semiconductor substrate 10 is, for example, a single crystal n-type silicon substrate. The semiconductor substrate 10 contains, for example, phosphorus (P) as an n-type impurity.

A p-type semiconductor region 22 is provided in the semiconductor substrate 10. The p-type semiconductor region 22 contains a p-type impurity. The p-type impurity is, for example, boron (B). The p-type impurity concentration of the p-type semiconductor region 22 is, for example, $1 \times 10^{19}$ cm$^{-3}$ or more. The p-type semiconductor region 22 serves as a common source line CSL. The p-type semiconductor region 22 may be provided as an independent region from the semiconductor substrate 10. That is, the p-type semiconductor region 22 may be provided on the semiconductor substrate 10 via an insulating layer. The p-type semiconductor region 22 is closer to the word line WL(18) than the n-type semiconductor region 20.

The n-type semiconductor region 20 is positioned on the bit line BL side of the semiconductor layer 24. The n-type semiconductor region 20 contains an n-type impurity. The n-type semiconductor region 20 is, for example, polycrystalline silicon containing the n-type impurity. The n-type impurity is, for example, phosphorus (P) or arsenic (As). An n-type impurity concentration of the n-type semiconductor region 20 is, for example, $1\times10^{19}$ cm$^{-3}$ or more.

Figure 12:
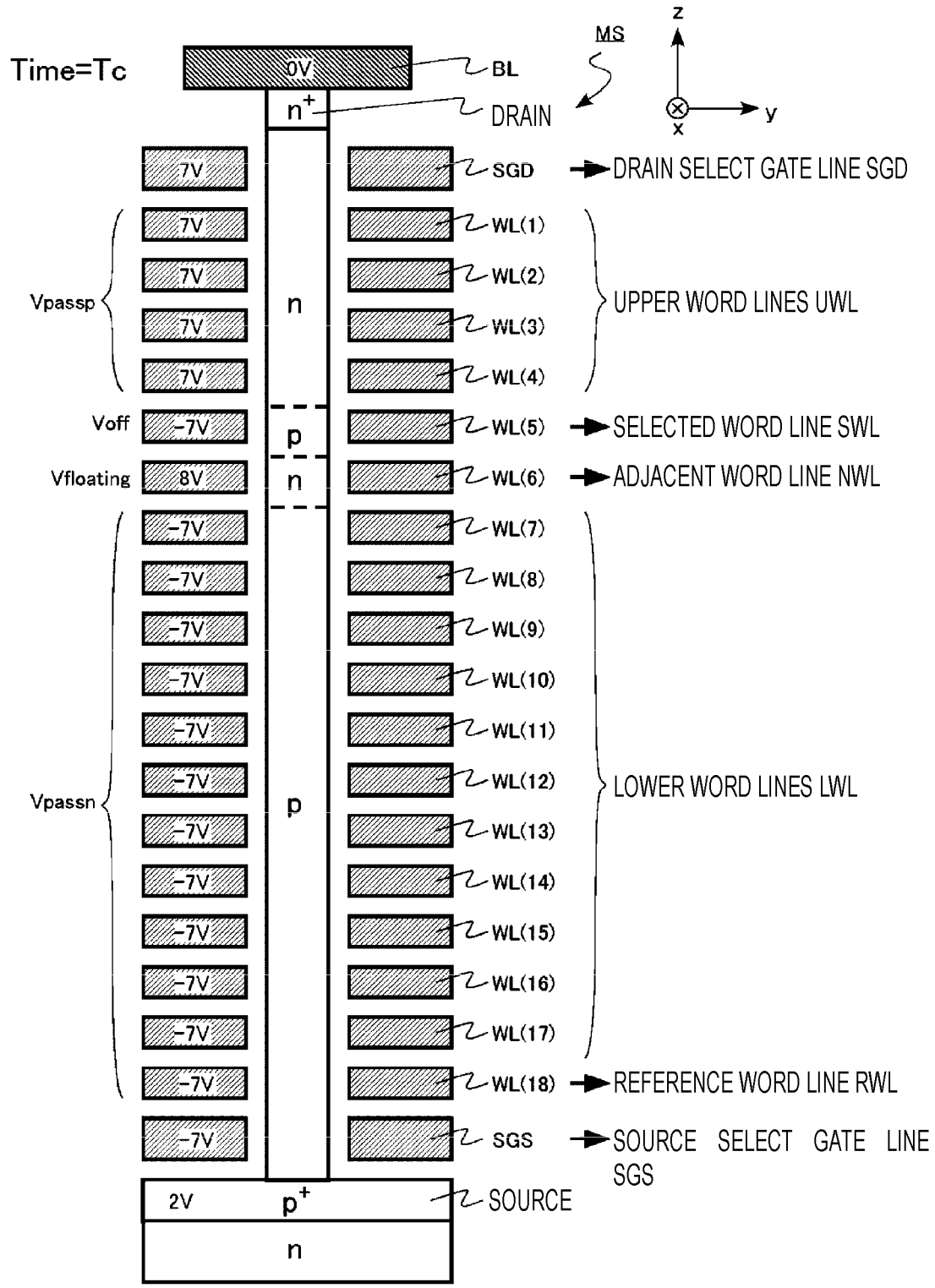
FIG. 12 is a schematic view illustrating a data read sequence of the semiconductor memory device according to the fourth embodiment.

FIG. 12 is a schematic view illustrating a data read sequence of the semiconductor memory device according to the fourth embodiment. FIG. 12 illustrates designations of each layer and each region. FIG. 12 is a diagram corresponding to FIG. 6 according to the first embodiment.

In the three-dimensional NAND flash memory of the fourth embodiment, the same data read sequence as that in the three-dimensional NAND flash memory of the first embodiment is applied.

As described above, according to the fourth embodiment, similar to the first embodiment, a semiconductor memory device is implemented, in which the erroneous reading of data of the selected memory cell is prevented and the enhancement of the read characteristic is enabled.

Fifth Embodiment

A semiconductor memory device of a fifth embodiment is different from the semiconductor memory device of the first embodiment in that at the time of reading a selected memory cell, an n-type region of a semiconductor layer is used as an energy barrier of the selected memory cell and a p-type region of the semiconductor layer is used as an energy barrier of an adjacent memory cell. Hereinafter, a part of the description of contents duplicated with the semiconductor memory device of the first embodiment will be omitted.

Figure 13:
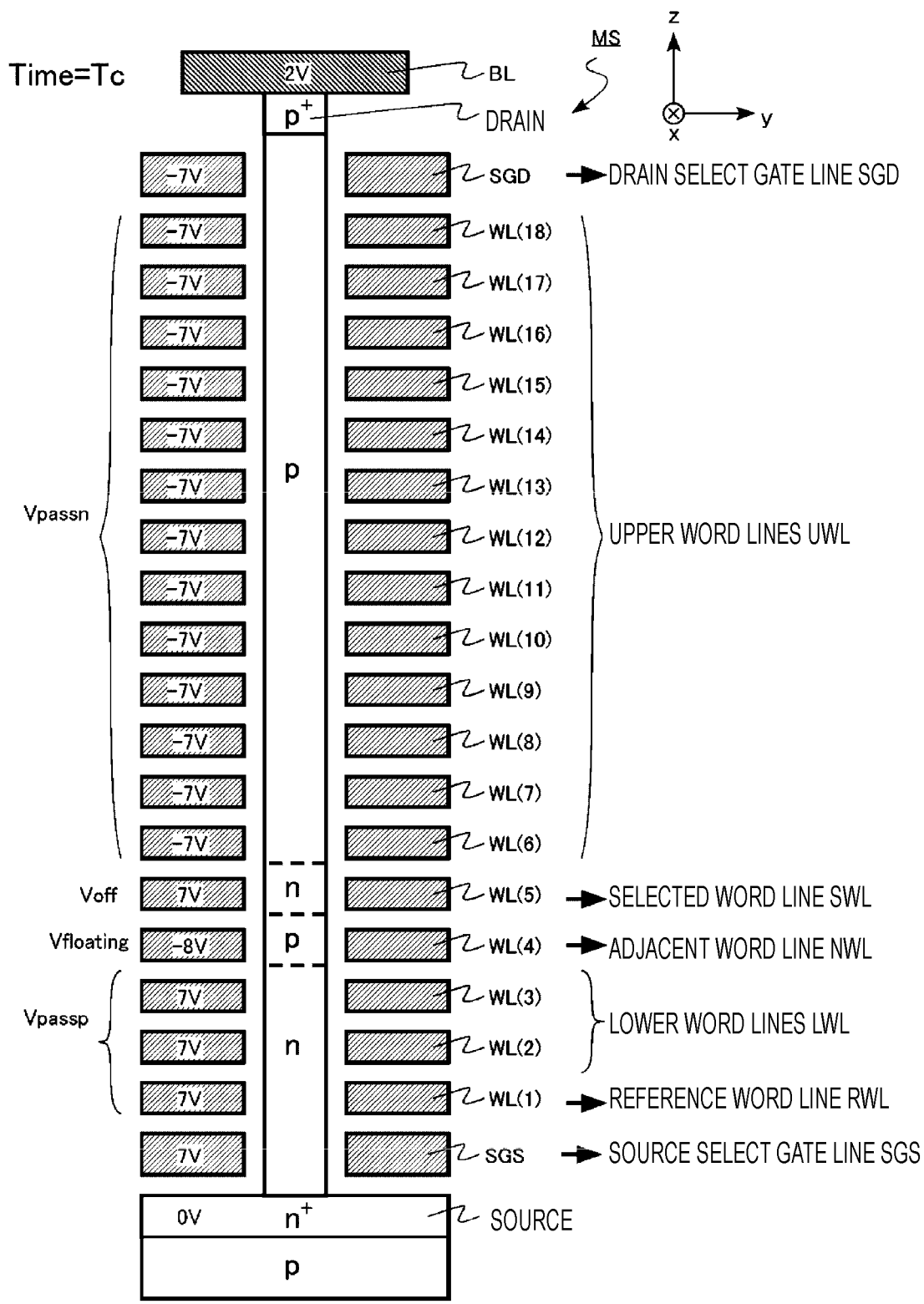
FIG. 13 is a schematic view illustrating a data read sequence of a semiconductor memory device according to a fifth embodiment.

FIG. 13 is a schematic view illustrating a data read sequence of the semiconductor memory device according to the fifth embodiment. FIG. 13 illustrates designations of each layer and each region. FIG. 13 is a diagram corresponding to FIG. 6 according to the first embodiment.

The semiconductor memory device according to the fifth embodiment is a three-dimensional NAND flash memory in which memory cells are arranged three-dimensionally. The semiconductor memory device according to the fifth embodiment is a positive feedback type three-dimensional NAND flash memory in which a p-type semiconductor region is provided at one end of the memory string.

In the three-dimensional NAND flash memory of the fifth embodiment, a first memory cell MC(1) becomes a reference memory cell.

Hereinafter, a method for controlling the three-dimensional NAND flash memory according to the fifth embodiment will be described with a case of reading data of the memory cell MC as an example. In particular, a case of reading the data of the memory cell MC(5) will be described as an example.

The selected word line SWL corresponds to the word line WL(5). The adjacent word line NWL corresponds to the word line WL(4). Further, lower word lines LWL correspond to the word lines WL(2) and WL(3). In addition, upper word lines UWL correspond to the word lines WL(6) to WL(18). Further, a reference word line RWL corresponds to the word line WL(1).

At the time of reading the data of the memory cell MC(5), reading and erasing of data of the memory cells MC(2) to MC(4) which exist between the memory cells MC(1) and MC(5) are preferentially performed in order from the side of the memory cell MC(1).

Further, unlike the case of the first embodiment, when data of the memory cell MC is read, the positive off-voltage Voff is applied to the selected word line SWL, and the negative floating voltage Vfloating is applied to the adjacent word line NWL. Thus, at the time of reading from the selected memory cell, the n-type region of the semiconductor layer is used as the energy barrier of the selected memory cell, and the p-type region of the semiconductor layer is used as the energy barrier of the adjacent memory cell.

In the three-dimensional NAND flash memory according to the fifth embodiment, the erroneous reading of data of a desired memory cell MC is prevented as in the first embodiment. Therefore, a three-dimensional NAND flash memory may be implemented, which enables the enhancement of the read characteristic.

As described above, according to the fifth embodiment, similar to the first embodiment, a semiconductor memory device is implemented, in which the erroneous reading of data of the selected memory cell is prevented and the enhancement of the read characteristic is enabled.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
a plurality of conductive layers from a first conductive layer to an $n^{th}$ conductive layer stacked in a first direction;
a first semiconductor region of a first conductive type and having a first conductive impurity concentration;
a second semiconductor region of a second conductive type, having a second conductive impurity concentration, closer to the $n^{th}$ conductive layer than the first semiconductor region;
a semiconductor layer provided between the first semiconductor region and the second semiconductor region, extending in the first direction, extending in the conductive layers, and having an impurity concentration lower than the first conductive impurity concentration and the second conductive impurity concentration;
a plurality of charge storage regions from a first charge storage region to an $n^{th}$ charge storage region provided between the conductive layers and the semiconductor layer; and
a control circuit controlling each voltage applied to the conductive layers to prevent charges from being stored during any write sequence in at least one charge storage region among the charge storage regions.

2. The semiconductor memory device according to claim 1, wherein the at least one of the plurality of charge storage regions include an $m^{th}$ ($1<m<n$) charge storage region.

3. The semiconductor memory device according to claim 2, wherein the at least one of the plurality of charge storage regions include an $x^{th}$ ($1\leq x<n-9$) charge storage region and a $y^{th}$ ($y=x+9$) charge storage region.

4. The semiconductor memory device according to claim 1, wherein the at least one of the plurality of charge storage regions include one of two adjacent charge storage regions among the plurality of charge storage regions.

5. The semiconductor memory device according to claim 1, wherein the control circuit is configured to control the voltage applied to the conductive layers to, at a time of reading data based on a charge amount in an $s^{th}$ ($0 \leq s \leq n$) charge storage region, perform reading of data based on a charge amount in at least one of the plurality of charge storage regions other than the $s^{th}$ charge storage region.

6. The semiconductor memory device according to claim 1, wherein the control circuit is configured to control the voltage applied to the conductive layers to, at a time of reading data based on a charge amount in a $q^{th}$ (0≤q≤n) charge storage region, perform reading and erasing of data based on a charge amount in a charge storage region between the at least one of the plurality of charge storage regions and the $q^{th}$ charge storage region in order from the side of the at least one of the plurality of charge storage regions.

7. The semiconductor memory device according to claim 1, wherein a width in the first direction of at least one conductive layer among the conductive layers with the at least one charge storage regions disposed between the at least one conductive layer and the semiconductor layer is different from a width in the first direction of at least one other conductive layer among the conductive layers.

8. The semiconductor memory device according to claim 1, further comprising:
a write voltage generation circuit configured to generate a write voltage for storing charges in a charge storage region other than the at least one of the plurality of charge storage regions among the plurality of charge storage regions,
wherein at least one conductive layer among the conductive layers with the at least one of the plurality of charge storage regions interposed with the conductive layer and the semiconductor layer is not electrically connected to the write voltage generation circuit.

9. The semiconductor memory device according to claim 1, further comprising:
an insulating layer provided between the conductive layers.

10. The semiconductor memory device according to claim 1, wherein the semiconductor layer is polycrystalline silicon.

11. The semiconductor memory device according to claim 1, wherein the first conductive type is an n-type and the second conductive type is a p-type.

12. The semiconductor memory device according to claim 11, wherein at a time of reading data based on a charge amount in a $p^{th}$ (1<p<n) charge storage region, the control circuit is configured to apply a first positive voltage to at least one of first to $(p-1)^{th}$ conductive layers, apply a second negative voltage to at least one of $(p+2)^{th}$ to $n^{th}$ conductive layers, apply a third positive voltage to a $(p+1)^{th}$ conductive layer, and change a fourth voltage applied to a $p^{th}$ conductive layer from a negative voltage to a positive voltage.

13. The semiconductor memory device according to claim 12, wherein the third voltage is applied to at least the $(p+1)^{th}$ conductive layer and the $(p+2)^{th}$ conductive layer.

14. The semiconductor memory device according to claim 13, wherein the third voltage is higher than the first voltage.

15. The semiconductor memory device according to claim 14, wherein an absolute value of a fifth voltage applied to at least one of the conductive layers with the at least one charge storage region interposed between the conductive layer and the semiconductor layer is larger than an absolute value of the first voltage and an absolute value of the second voltage.

16. The semiconductor memory device according to claim 10, wherein the control circuit is configured to read the data based on the charge amount in the $s^{th}$ charge storage region in a state where the semiconductor layer below the $s^{th}$ (1≤s≤n−1) conductive layer is the second conductive type and the semiconductor layer below an $(s+1)^{th}$ conductive layer is the first conductive type.

17. A semiconductor memory device comprising:
a plurality of conductive layers including a first conductive layer to an $n^{th}$ conductive layer stacked in a first direction;
a first semiconductor region of a first conductive type and having a first conductive impurity concentration;
a second semiconductor region of a second conductive type and having a second conductive impurity concentration, the second semiconductor region closer to the $n^{th}$ conductive layer than the first semiconductor region;
a semiconductor layer provided between the first semiconductor region and the second semiconductor region, extending in the first direction, extending in the n conductive layers, and having an impurity concentration lower than the first conductive impurity concentration of the first semiconductor region and the second conductive impurity concentration of the second semiconductor region;
a plurality of charge storage regions from a first charge storage region to an $n^{th}$ charge storage region provided between the conductive layers and the semiconductor layer; and
a control circuit configured to read data based on a charge amount in an $s^{th}$ charge storage region, among the plurality of charge storage regions, in a state where the semiconductor layer below an $s^{th}$ (1≤s≤n−1) conductive layer is the second conductive type and the semiconductor layer below an $(s+1)^{th}$ conductive layer is the first conductive type,
wherein at a time of reading the data based on the charge amount in the $s^{th}$ charge storage region, a $(s+1)^{th}$ charge storage region is in a state where charges are not stored.

18. A method for controlling a semiconductor memory device, the method comprising:
providing a plurality of conductive layers from a first to an $n^{th}$ conductive layer stacked in a first direction;
providing a first semiconductor region of a first conductive type and having a first conductive impurity concentration;
providing a second semiconductor region of a second conductive type closer to the $n^{th}$ conductive layer than the first semiconductor region, the second semiconductor region having a second conductive impurity concentration;
providing a semiconductor layer provided between the first semiconductor region and the second semiconductor region, extending in the first direction, extending in the n conductive layers, and having an impurity concentration lower than the first conductive impurity concentration of the first semiconductor region and the second conductive impurity concentration of the second semiconductor region;
providing a plurality of charge storage regions from a first to an $n^{th}$ charge storage region provided between the n conductive layers and the semiconductor layer; and
preventing charges from being stored during any write sequence in at least one charge storage region among the charge storage regions.

19. The method according to claim 18, wherein the at least one charge storage region includes an $m^{th}$ (1<m<n) charge storage region.

20. The method according to claim 18, further comprising, at a time of reading data based on a charge amount in an $s^{th}$ (0≤s≤n) charge storage region, reading data based on a charge amount in at least one charge storage region other than the $s^{th}$ charge storage region.

21. The method according to claim 18, further comprising, at a time of reading data based on a charge amount in a $q^{th}$ ($0 \leq q \leq n$) charge storage region, reading and erasing data based on a charge amount in a charge storage region between the at least one charge storage region and the $q^{th}$ charge storage region in order from the side of the at least one charge storage region.

\* \* \* \* \*